United States Patent
Hüttinger et al.

(12)

(10) Patent No.: US 6,197,374 B1
(45) Date of Patent: Mar. 6, 2001

(54) METHOD FOR CHEMICAL VAPOR INFILTRATION OF REFRACTORY SUBSTANCES, ESPECIALLY CARBON AND SILICON CARBIDE

(75) Inventors: Klaus J. Hüttinger, Karlsruhe; Walther Benzinger, Neuleiningen, both of (DE)

(73) Assignee: Sintec Keramik GmbH & Co KG, Buching (DE)

( * ) Notice: Subject to any disclaimer, the term of this patent is extended or adjusted under 35 U.S.C. 154(b) by 0 days.

(21) Appl. No.: 09/297,954
(22) PCT Filed: Nov. 7, 1997
(86) PCT No.: PCT/DE97/02597
  § 371 Date: May 7, 1999
  § 102(e) Date: May 7, 1999
(87) PCT Pub. No.: WO98/21163
  PCT Pub. Date: May 22, 1998

(30) Foreign Application Priority Data

Nov. 8, 1996 (DE) .............................. 196 46 094

(51) Int. Cl.$^7$ ................................ C23C 16/26
(52) U.S. Cl. .................. 427/249.2; 427/249.15; 427/249.16; 427/255.12; 427/900
(58) Field of Search ................ 427/224, 249.2, 427/255.12, 249.15, 249.16, 900; 428/408; 188/250 R, 251 R, 251 A; 623/16

(56) References Cited

U.S. PATENT DOCUMENTS

| 5,217,755 | * | 6/1993 | Thebault et al. . | |
|---|---|---|---|---|
| 5,300,322 | | 4/1994 | Lowden | 427/255 |
| 5,348,774 | | 9/1994 | Golecki | 427/543 |
| 5,350,545 | * | 9/1994 | Streckert et al. . | |
| 5,411,763 | | 5/1995 | Weaver et al. | 427/249 |
| 5,480,678 | | 1/1996 | Rudolph et al. | 427/248.1 |
| 5,545,435 | | 8/1996 | Steffier | 427/249 |
| 5,558,907 | | 9/1996 | Steffier | 427/227 |
| 5,738,908 | * | 4/1998 | Rey et al. . | |
| 5,744,075 | * | 4/1998 | Klett et al. . | |
| 5,916,633 | * | 6/1999 | Lackey et al. . | |

FOREIGN PATENT DOCUMENTS

| 3922539 A1 | 1/1991 | (DE) | C04B/35/52 |
|---|---|---|---|
| 4142261 | 6/1993 | (DE) | B29C/67/16 |
| WO 95/16803 | 6/1995 | (WO) | C23C/16/44 |
| WO 95/23155 | 8/1995 | (WO) | C07F/15/04 |

* cited by examiner

*Primary Examiner*—Timothy Meeks

(57) ABSTRACT

A method for isothermic, isobaric chemical vapor infiltration (CVI) of refractory substances, especially of carbon (C) and silicon carbide (SiC), based on diffusion in a porous structure, whereby the pressure of the gas or partial pressure of an educt gas contained in the gas and the dwell time of the gas in the reaction zone are set at a given temperature in the reaction zone so that a deposition reaction occurs in the porous structure in the area of pressure or partial pressure of the saturation adsorption of the gaseous compounds forming the solid phase, saturation adsorption meaning that the deposition speed remains substantially constant at increased pressure of the gas or partial pressure of the educt gas. The reaction of the educt gas is limited in such a way that no more than 50% of the elements in the educt gas as it flows through the reaction zone are deposited as a solid phase in the porous structure.

24 Claims, 20 Drawing Sheets

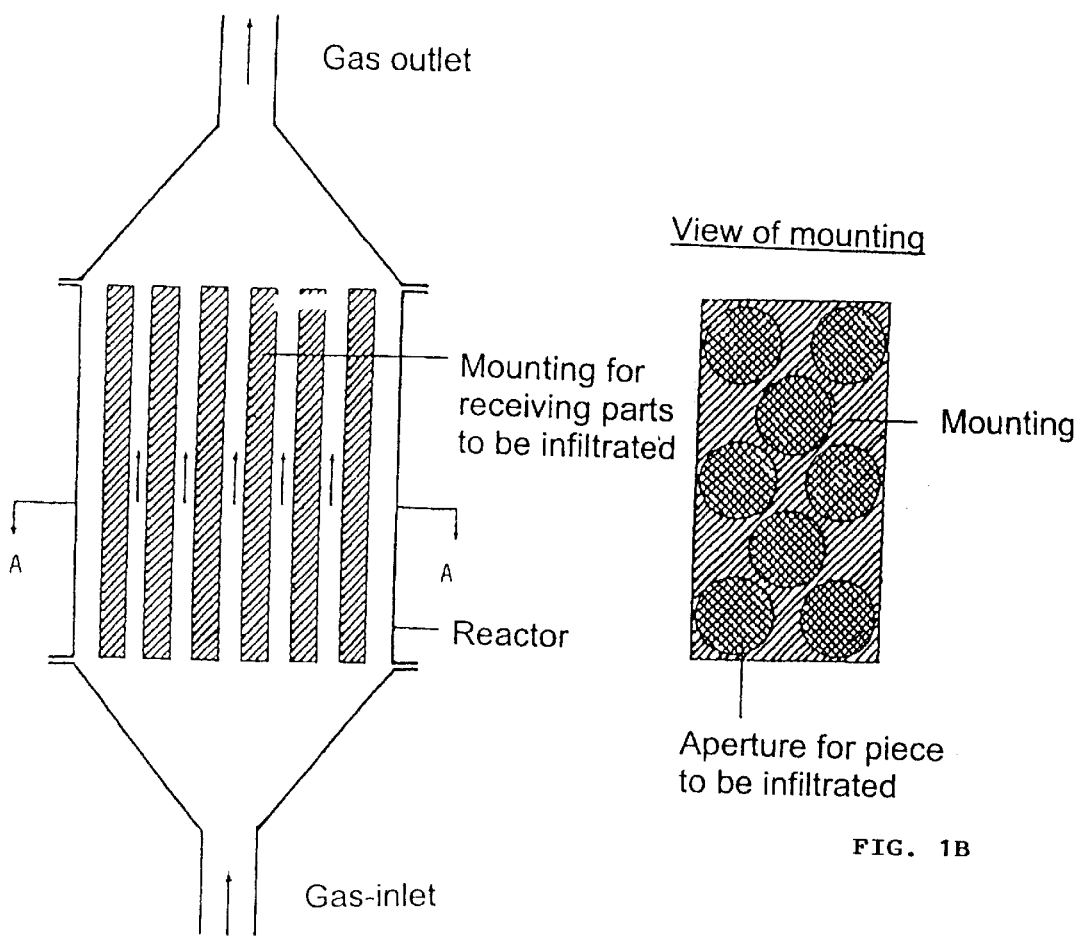
FIG. 1A
FIG. 1B
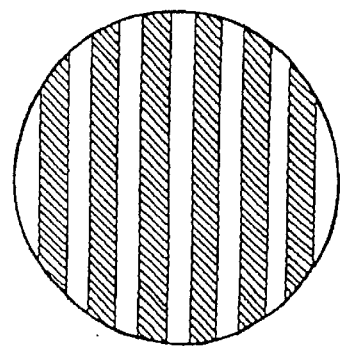
FIG. 1C

Horizontal view / section

METHOD FOR CHEMICAL VAPOR INFILTRATION OF REFRACTORY SUBSTANCES, ESPECIALLY CARBON AND SILICON CARBIDE

The invention concerns a method of chemical gas phase infiltration of refractory substances, in particular carbon and silicon carbide and the prefered method of application.

BACKGROUND

Methods of deposition of solid phases on substrates by decomposition of volatile or gaseous compounds which contain the solid phase elements are designated as chemical vapor deposition. If this deposition takes place in the open pores of a porous substrate or in the cavities of a porous structure, then it is known as chemical vapor infiltration. Chemical vapor deposition (CVD) and chemical vapor infiltration (CVI) are of significance primarily with respect to the deposition and infiltration of refractory materials such as carbon, carbides, nitrides, borides, oxides etc. (see for example W. J. Lackey, in Encyclopedia of Composites, Vol. 1, edited by Stuart M. Lee, VCH Publishers, Inc., New York, 1990, pg. 319). CVI methods allow a densification of structure or, when the porous structure consists of fibers, an introduction of a matrix and, with this, the production of composite, strengthened fiber materials.

Both chemical vapor deposition as well as chemical vapor infiltration are extremely complex processes. In the chemical vapor deposition of compounds such as e.g. silicon carbide, there exists the additional problem that it is in general difficult to attain solid phase deposition in stoichiometric compositions for larger parts in the generation of a coat of even thickness.

In chemical gas phase infiltration there is another and particular problem, that the volatile or gaseous starting compounds must be transported into the depth of the pores before dissolving. If decomposition occurs on the surface of the porous structure of in the pore entrances, then the pores become clogged. The pores are then not filled, which is the whole aim of the process.

Various embodiments of methods for chemical vapor infiltration (CVI) are known.

Procedurally the simplest to perform are methods of isobaric and isothermic chemical vapor infiltration. In this method the entire process space exists at constant temperature and pressure. Here, however, only very low pressures or partial pressures of educt gases can be used, when necessary with addition of inert or dilution gases, so that extremely long infiltration times are required.

In order to shorten the infiltration times it is proposed according to WO 95/16803 that for the chemical vapor infiltration of silicon carbide using methyltrichlorosilane (MTS) as educt gas, the educt gas should be preheated to temperatures well above the decomposition temperature of MTS i.e. to 960° C. to 1050° C. while at the same time setting pressures up to 25 kPa and to remove silicate components from the gas phase at the outlet of the reaction zone. Preheating the MTS to such high temperatures leads to a high rate of deposition of the substances added with the gas, which in turn achieves a high production speed but at the same time leads to uneven deposits, particularly on the surface, and therefore to minimal extents of pore filling.

Optimal or maximal pore filling is therefore only possible at extremely slow deposition or infiltration rates (e.g. W. V. Kotlensky, in Chemistry and Physics of Carbon, Vol. 9, edited by P. L. Walker and P. A. Thrower, Marcel Dekker, New York, 1973, pg. 173).

In order to successfully realize infiltration, low pressures, and particularly low partial pressures are recommended. The pressures realized under the conditions of industrially applied chemical vapor infiltration lie at least one to two orders of magnitude below normal pressure. Starting compounds are partially mixed with inert gases so that their partial pressure, and with it the deposition rate can be further lowered. Due to the low partial pressures, extremely long infiltration times of up to several weeks are required.

Since the isobaric and isothermic methods failed in achieving rapid production and high degrees of pore filling, the development of new methods was attempted, known as pressure gradient, temperature gradient and pressure switching methods. Such methods are for example known from Nyan-Hwa Tai and Tsu-Wei Chou, Journal of American Ceramic Society 73, 1489 (1990).

In the vacuum pressure pulsation method, the process pressure is continually varied to support the diffusion. The disadvantage of this method lies in the cost of the apparatus as well as in the filtration times, which are still very long.

Another well-known method is the temperature gradient method (e.g. U.S. Pat. Nos. 5,411,763, 5,348,774). In this method heat is removed from the side of the porous substrate facing the process gas stream by suitable measures, for example by cooling by the stream. The side of the porous substrate opposite to the gas stream is adjacent to a heating element. It is in this way that a temperature gradient crucial to the method is established normal to the surface of the substrate. The surface temperature on the cold side is adjusted with the gas stream such that no, or at least very little deposition takes place. It is in this way that narrowing of the pores in this region is avoided. The disadvantage of this method is the very high gas throughput necessary for cooling. The low yield of deposited material entails long production times. Much equipment is needed for the heating.

In a further known embodiment of CVI methods (DE 41 42 261) the gas is streamed through the porous substrate on the basis of forced convection whereby a pressure gradient is established. The infiltration time can be kept relatively short. After a certain level of pore filling however, the streaming through of the porous structure becomes more difficult.

From U.S. Pat. No. 4,580,524, a CVI method is known whereby temperature and pressure gradient techniques are combined with one another. In this way relatively short production times can be achieved. The disadvantage of such a method is the complicated reactor construction.

The task which provided the basis for the invention was to create a CVI method by which a high level of pore filling during a pre-set production time could be achieved, or alternatively, a shorter production time achieved for pre-set pore filling levels.

SUMMARY OF THE INVENTION

The task is solved by means of the invention of a method incorporating the features according to claim 1.

There is no question about it that an isobar, isotherm (under "isotherm" we understand a temperature constancy as great as possible in the reactor and even if this is not absolutely achieved, the term isotherm is still used) chemical gas phase infiltration is the simplest to execute and at the same time the most universal technical method.

The inventive method for chemical vapor infiltration of refractive materials, especially of carbon (C) and of silicon carbide (SiC), is based on diffusion in the porous structure and functions isothermally, in other words no temperature gradients are intentionally established. The infiltration takes place under isobaric conditions, e.g. the porous structure to be infiltrated is streamed with a gas in a reaction zone, but is not subjected to a flow through such that an appreciable pressure gradient is formed. Here, the gas pressure or the partial pressure of an educt gas contained within the gas and the persistence of the gas in the reaction zone are adjusted for the prescribed temperature in the reaction zone such that in the porous structure a deposition reaction in the pressure and partial pressure region of the saturation adsorption of the gaseous and volatile compounds forming the solid phase exists. Saturation adsorption means that the deposition rate remains substantially unchanged or is negligibly increased by a raising of the gas pressure or of the partial pressure of the educt gas. This means that the deposition or infiltration rate of the solid phase, in other words the refractory substances, formally progresses as a reaction of zeroth order, but any case as a reaction of order significantly less than one. Furthermore, the gas pressure or the partial pressure of an educt gas contained within the gas and the persistence of the gas in the reaction zone are adjusted for the prescribed temperature so that the transformation of the educt gas is limited such that in the flow through of the reaction zone no more than 50%, and preferably 10% to 25% of the solid-forming elements introduced into the educt gas are deposited in the porous structure. In addition, the porous structure is subjected to flow-through gas linearly from the bottom to the top through apertures of substantially identical width from 1 to 50 mm, preferably less than 25 mm.

This means for example that compared to conventional methods, substantially higher pressures and partial pressures of the educt gas are set, which are higher than those of known isobaric, isothermal methods, in order to enable high or the highest possible deposition rates. In light of the state of the art, these pressures are at least so high as to be characterized as disadvantageous.

Let it therefore be emphasized once again that such conditions allow not only maximum infiltration rates to be achieved but also maximum extents of pore filling.

In order to simultaneously achieve good pore filling while applying high pressure at the same time, the method according to the invention requires very special reaction control. Here, the choice of starting compound is of special importance. This means that for the deposition of any kind of refractory substance, special starting compounds must be chosen which best meet the requirements of the inventive method.

In order to explain the nature of the method according to the invention, it is necessary to describe the chemistry and kinetics of the decomposition of the starting compounds during simultaneous deposition of the solid phase. For reasons of simplicity, this is done by way of example of the deposition of the element carbon. Equation (1) shows a diagram with methane as the starting material.

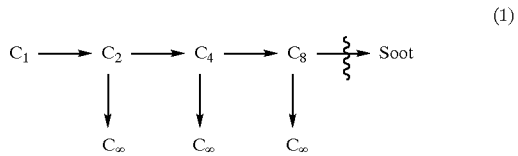

(1)

In this diagram $C_1$ is methane, $C_2$ and $C_4$ stand for $C_2$ and $C_4$ hydrocarbons such as e.g. ethylene, acetylene and butadiene. $C_6$ means benzene and if appropriate, benzene substitutes. The above reaction sequence describes the gas phase reactions in pyrolysis of methane as known for example in the petrochemical industry (crack reactions). The formation of higher aromatic compounds such as naphthalene, anthracene, pyrene etc. in the gas phase should be avoided as far as possible as they lead to nucleation in the gas phase and therefore to the undesired soot formation. The arrows in equation (1) pointing downwards are intended to illustrate the formation of carbon, in other words, its deposition on the substrate. The missing arrow under methane ($C_1$) means that this or the $C_1$ radicals arising from it are not in a position to form carbon or at least only if the speed can be reduced. The increasing thickness of the arrows from $C_2$ to $C_6$ is meant to make clear that the deposition speed increases from $C_2$ to $C_6$ at a considerable speed.

The diagram shows therefore, that methane is ideal as a starting compound of carbon for a chemical gas phase infiltration. Due to its small molar mass in comparison with other hydrocarbons, methane can diffuse in the pores with maximum speed but carbon deposition only comes about after the $C_2$, $C_4$ hydrocarbons and benzene are formed.

The use of methane for chemical vapor infiltration of carbon is not new; on the contrary, methane or natural gas alone find prefered implementation in the chemical vapor infiltration processes of carbon due to their inexpensiveness. The example however, clearly shows the importance of the starting compound for chemical gas phase infiltration. Analogous for example, would also be silicon carbide for chemical gas phase infiltration. In this case in technological areas i.e. in industrial processes, methylchlorosilane and in particular methyltrichlorosilane $CH_3SiCl_3$ are used almost exclusively. Especially for this starting compound it is stated that it already contains the elements of the solid phase to be deposited, namely silicon and carbon in stoichiometric composition. Indeed, in the deposition of silicon carbide from methyltrichlorosilane there normally occurs co-deposition of free carbon. In order to avoid this, mixtures of methyltrichlorosilane and hydrogen are used. If one regards the decomposition reactions, methyltrichlorosilane seems less well suited to vapor infiltration (equation 2):

(2)

Radicals immediately occur which can form silicon carbide by methyl radical reaction with a silicon atom and by silyl radical reaction with a carbon atom on the surface of the growing silicon carbide layer. If on the other hand the thermally considerably more stable compounds $SiCl_4$ and $CH_4$ are used, these can diffuse primarily into the pores before radicals are formed, from which then silicon carbide arises. In reality the gas phase chemistry is more complex, but consideration of these elementary and primary reactions is sufficient to illustrate the principle.

According to the invention the concentrations and the partial pressures of the starting compounds of the process in the gas volume adjacent to the pore openings, which corresponds to the free reactor volume, are set to equally high levels as at the entrance to the reactor. Decomposition of the starting compounds in the free reactor volume is largely avoided by suitable setting of the deposition temperature and most importantly the persistence time. For this reason only extremely short persistence times are realized. By this, decomposition reactions within the free reactor volume which are due to extended persistence times and which lead to undesirable deposition on the surface or in the pore entrances of porous substrates are avoided.

The decomposition reactions can be especially impressively documented with the aid of equation (1) for methane. Over longer periods in the free reactor volume, $C_2$ and $C_4$ species and benzene can form, which automatically leads to carbon deposition on the surface and at the pore openings. At high partial pressures of the starting materials this problem is so critical that conventional methods with high partial pressures lead to extremely poor results.

According to the invention, advantage is taken of the fact that short persistence times in the free reactor volume do not mean short times in the pores. Despite the short persistence time set according to the invention, the decomposition reactions can accordingly occur in the pores, and the solid phase can thus be deposited. The duration of the persistence time is set such that a low percentage transformation of the educt gas, i.e. a low deposition rate in solid phase of the elements carried in the educt gas which form the solid phase in the porous structure is attained. The concrete persistence time to set in order to attain the desired deposition rate for a given process temperature and pressure can be determined by test experiments by fixing the composition and amount of the educt gas used as well as by weighing the structure before and after vapor infiltration.

The short persistence times which are set are a necessary but not sufficient feature of the method according to the invention. Short persistence times imply high flow rates, in which there is a strong tendency to form eddy currents. Due to the circulation flow in eddy currents, the persistence time is locally increased, leading to more pronounced deposition, in chemical vapor infiltration by necessity on the surface of the substrate. At high pressures and partial pressures as well as by the method according to the invention this is especially problematic due to the high concentrations and partial pressures of the starting materials. However, by subjecting the porous structure to linear flow from bottom to top, the circulation flow caused by convection are dampened. According to the invention the flow is applied through apertures of substantially identical width of 1 to 50 mm, preferably less than 25 mm. These aperture widths are just big enough to avoid having to establish a deleterious substantial pressure gradient in order to attain the flow rate as prescribed by the persistence time, yet at the same time are small enough so that the formation of circulatory flow and the resulting local increase in persistence time can be avoided.

The combination according to the invention of in themselves counterproductive measures, namely the setting of high pressures on the one hand and of low deposition rates on the other, has the effect that chemical vapor deposition according to the method of the invention attains a combination of high production speed and a high extent of pore filling which up to now has not been anywhere near possible. A further increase in the extent of pore filling is attained by applying gas through small apertures, whereby the required production time is reduced as well by the avoidance of deposits on the surface of the part which might have to be filed off.

Reactor constructions and reactor parts are used in performing the method which allow implementation of the special conditions of the method in a technically and financially optimum manner.

The reaction temperature plays a critical role in the method of the invention. It influences both the rate of reaction i.e. the decomposition and deposition reactions as well as the diffusion into or within the pores, although in very different ways. For the reaction rate r equation (3) is valid in the simplest case, under the assumption of a first order reaction.

$$|r|=k^*c_i \tag{3}$$

For the diffusion speed j equation (4)

$$|j|=D^*c_i \tag{4}$$

In these equations:
k=rate constant of the reaction
D=diffusion coefficient
$c_i$=concentration of a component The reaction rate constant k and the diffusion coefficient D are influenced by the temperature as follows: (equation (5) and (6)):

$$k \sim \exp(-E_A/RT) \tag{5}$$

$$D \sim T^{1.5} \tag{6}$$

In these equations:
$E_A$=activation energy
R=universal gas constant
T=temperature in Kelvin For carbon deposition the activation energies are in part extraordinarily high, in the case of methane, the activation energy is 105 kcal/mol. A small change in temperature therefore causes a very large change in the reaction rate (equation (3) and (5)), whereas the influence on diffusion is relatively small (equation (4) and (6)). At lower temperatures the diffusion is greatly favoured in comparison to the reaction, which is of advantage to the in-pore deposition, which is the deposition inside the pores. This conclusion is given by the state of state of the art. However, at the same time a slow reaction rate is the outcome, which leads to long production times.

According to the invention, however, a hitherto unnoticed aspect is exploited. The equations (3) and (4) show that the reaction rate and the diffusion rate are dependent on the concentration $c_i$ or on the corresponding partial pressure $p_i$. If these are increased, the reaction rate and the diffusion rate are accelerated equally, whereby at least no disadvantage arises for the diffusion rate with respect to the reaction rate. The influence of a decreased temperature on the reaction rate can be compensated by a significant increase of the concentration $c_i$ or the partial pressure $p_i$.

In chemical vapor deposition and therefore also in chemical vapor infiltration, the reaction in the decisive step is not a homogeneous reaction but a heterogeneous one, so that the surface reaction has to be considered in the deposition of the carbon. In the case of a one-center-reaction, the order of the reaction speed changes with increasing partial pressure formally from one to zero; the latter is known as a saturation adsorption. This signifies for equation (3) that the reaction rate becomes independent of the concentration $c_i$ or the partial pressure $p_i$ (equation (7)):

$$|r|=k \tag{7}$$

If in this case the concentration or the partial pressure is increased, the reaction rate remains constant, the diffusion rate however increases, which is of excellent advantage for an in-pore deposition. Low temperatures and high concentrations or partial pressures are therefore simultaneously excellent criteria for the method of the invention.

According to the invention it is possible that the gas flow to which the porous structure is subjected contains a significant portion of inert or dilution gas, e.g. nitrogen, argon etc. According to a prefered embodiment of the invention, however, no inert or dilution gas is added to the gas. This means that gas such as certain natural gases which by nature contains a small amount of inert or dilution gas can certainly be used. However, no additional inert or natural gas should be added to lower the partial pressure of the starting materials.

The omitting of inert gas according to the prefered embodiment of the invention has multiple advantages. In comparison to the process in the state of the art, high concentrations or partial pressures of the starting materials are achieved. A higher concentration of the starting materials in the free reactor volume increases the concentration gradient towards the pores and hereby also the motive force of the diffusion into the pores. As high concentrations or partial pressures as possible are also of essential importance for another reason. If the partial pressures are too small, the starting materials completely react as early as at the entrances to the pores and no deposition occurs in the depth of the pores. As a result the pores would become clogged without being filled.

Furthermore, inert gas molecules can collide with the starting materials in the gas phase, accelerating the decomposition of the starting materials. Inert gas is therefore not absolutely inert. In the case of carbon deposition or carbon infiltration with methane as starting material, for example, carbon deposition on the outer surface or at the entrance to the pores of the porous substrate is decreased by omitting inert gas so that higher degrees of pore filling are made possible.

The exclusion of addition of inert or dilution gas in the prefered embodiment of the method of the invention is carried out bearing this in mind, despite the fact that this exclusion increases the partial pressure and thereby has an assumedly worsening effect on the filling of the pores.

If the partial pressure is increased with the requirement that inert and dilution gas is not used, this entails an increase in the total pressure, which in turn has a negative influence on the diffusion coefficient D and thus also on the diffusion rate j as shown in equation (8):

$$D \sim p^{-1} \qquad (8)$$

p=total pressure

This influence of the total pressure on the reaction rate does not represent any problem for the method according to the invention. This is for two reasons:

(1) in depositions with pure gas without inert gas the saturation adsorption is achieved at a lower pressure, since the partial pressure is identical to the total pressure.

(2) In the case of saturation absorption, the ratio of reaction rate and diffusion rate is not influenced by increasing pressure of the starting gases, as both the reaction rate according to equation (7) and the diffusion rate according to equation (9) are independent of the total pressure:

$$|j| = D_{(p)} * c \sim 1/p * p \sim 1 \qquad (9)$$

$D_{(p)}$ corresponds to equation (8)

In taking advantage of these effects the invention achieves with high pressures of the starting gases the creation of optimum conditions for an in-pore deposition. In the case of multi-center-reactions, the kinetics of the surface reaction are substantially more complex. Nevertheless it is also true in this case that the maximum reaction rate in saturation adsorption of all species, which at all events must be striven for, at a constant partial pressure ratio of the starting materials does not lead to any further increase in the reaction rate of the surface reaction. The same considerations as for the one-center-reaction are therefore valid.

Decisive for the method according to the invention are therefore the right choice of starting materials, high pressures and especially high partial pressures of the starting materials and low temperatures, which in conjunction with a short persistence time, allow only minor decomposition of the starting materials in the free reaction volume.

According to the invention, suitable low temperatures can be realized for vapor infiltration with the respective starting materials.

According to a prefered embodiment, temperatures in the range of 1.000 to 1.200° C. are set in the reaction zone for vapor infiltration of C.

According to a further prefered embodiment, temperatures in the range of 900 to 1.100° C. are set in the reaction zone for the vapor infiltration of SiC.

According to a prefered embodiment of the invention, gas is passed over the porous structure which comprises a by-product generated during vapor infiltration. Preferably hydrogen gas is added to the educt gas for the vapor infiltration of C. The volume ratio of methane or natural gas to added hydrogen is 20:1 to 2:1, preferably 10:1 to 5:1. Hydrogen chloride gas is preferably added to the gas educt for vapor infiltration on SiC. The molar ratio of methyltrichlorosilane to added hydrogen chloride gas is preferably 5:1 to 1:5, more preferably 3:1 to 1:2.

Two further advantageous effects are achieved by the addition of $H_2$ to the educt gas methane:

(1) The diffusion coefficient of methane is substantially increased, meaning that pore diffusion is favored in a decisive manner.

(2) The volume increase caused by the complete decomposition of methane into carbon and hydrogen in the pores of the porous structure is decreased by the hydrogen content, and the rinsing effect is accordingly weakened.

The addition of hydrogen has the effect that even at low partial pressures of methane it is possible to regulate the conditions of the saturation adsorption. However, according to the invention, it is also possible to achieve saturation absorption even for lower partial pressures of methane independent of the amount of hydrogen present by decreasing the temperature. This measure is therefore also valid if no hydrogen is added to the methane. Even a relatively small temperature decrease on the order of magnitude of 20° C., for example from 1,100° C. to 1,080° C., is sufficient to significantly decrease the partial pressure of methane at which saturation adsorption is achieved. Such small decreases in temperature barely influence the diffusion into the pores of the porous structure since the diffusion coefficients exhibit only minimal temperature dependence. The effect of a temperature decrease of 20° C. on the lowering of the partial pressure of methane at which saturation adsorption is achieved is comparable to the effect of a hydrogen addition at a methane/hydrogen ratio of 6:1.

According to the invention it is therefore possible to adjust the saturation adsorption as a decisive criterion of the method by means of two different and largely independent parameters within a relatively broad range of pressures or partial pressures. With this it is possible to adjust the conditions of the-infiltration according to the invention, especially in respect to the saturation adsorption for each porous structure, independent of its porosity, distribution of pore radii or pore structure, and especially independent of its geometric dimensions. It is especially advantageous that upon variation of the decisive parameters temperature and partial pressure of hydrogen, no unwanted disadvantages for the method are created. To achieve an infiltration which is as fast as possible, high pressures or partial pressures are prefered, especially pressures of 15 to 25 kPa.

Analogous controlling means for the saturation adsorption also exist in the case of a chemical vapor infiltration of silicon carbide. A decrease in temperature always leads to a saturation adsorption at low partial pressures. It is therefore possible to adjust the pressure or the partial pressure its optimum value, e.g. also to increase it, by increasing the temperature. At the point of saturation adsorption this means that the deposition rate does not increase further, yet the diffusion stream in the pores does increase since the motive force of the diffusion is stronger due to the higher partial pressure. The role played by hydrogen with respect to the saturation adsorption during the infiltration of C is assumed by hydrogen chloride during the infiltration of silicon carbide. In using hydrogen chloride the saturation adsorption can be achieved at lower pressures or partial pressures as well; the side effect on diffusion is not at as important as in the case for hydrogen. The problem of volume increase during the total decomposition of methyltrichlorosilane into silicon carbide and hydrogen chloride in the pores of the porous structure is a priori even larger than during the total decomposition of methane; it is however already diminished drastically by the use of mixtures for the deposition or infiltration of silicon carbide consisting of methyltrichlorosilane and hydrogen in which the amount of hydrogen surpasses the proportion of methyltrichlorosilane manyfold.

The method according to the invention is preferably conducted in a reactor having a specific reactor construction, or at least in a reactor with a special mounting, which are also the subject matter of the invention. Since brake disks made of carbon fiber-reinforced carbon are among the most important products which are manufactured by chemical vapor infiltration in large quantity, specifically of carbon into carbon fiber structures, and since they furthermore have potential for growth, the principle of reactor construction or of the reactor components will be explained by the following example.

In order to gain a better overview, the carrying or holding devices in the vertical cross section have been omitted. The fitted parts can be composed of ceramic material; preferably however carbon of graphite is used. The thickness of the fitted parts and the recesses correspond to the thickness and diameter of the brake discs. The starting material streams through the interstices, whose width is not represented to scale, between the fitted parts. Where there is a correspondingly small distance between the fitted parts, a very high speed can be achieved with a relatively small volume of flow and low tendency to form vortices. This is particularly important, since only a minimum turnover of the starting materials can be permitted due to the decomposition.

The design of the reactor according to FIG. 1 can always be used when relatively flat parts or, as in the present example, when parts with large diameters or length to thickness ratio are to be infiltrated. If the task concerns the infiltration of parts with medium or small diameter/length to thickness ratio, then a reactor construction in accordance with FIG. 2 is appropriate for the method. It shows a horizontal cross section of the reactor. In this case the reactor construction is composed of a full material, preferably of carbon or graphite, with vertical pipes containing the parts which are to be infiltrated. The same construction can also be used when the radial infiltration of flat parts is favoured instead of axial infiltration, for example in layers of fibre weaves.

Taking the example of this reactor construction, the principle of infiltration of small or the smallest partial pressures, as used in technology, can be explained so as to be easily understood. As a consequence of the very low pressure, the diffusion rate is high, so that the diffusion into the pores is favored. This does not exclude that the starting compounds already react at the opening to the pore, namely as a result of adsorption to active centres. At the beginning of infiltration deposition occurs only in the lower area of the reactor since the starting materials are completely converted i.e. used up. With continued infiltration and filling of the pores and with it the reduction of the internal surface, the consumption of the starting materials in this area declines so that the infiltration now takes place in the middle area. As a whole, this means that the reaction front migrates through the reactor from the bottom to the top. As well as the low infiltration rate in itself, it also leads to an increase in infiltration time.

In principle, the method according to the invention can be carried out with the reactors described. Since there is a low level of turnover of the starting materials however, a circulation system could be of economic advantage. In order to put this into practice it is necessary to consider the gas leaving the reactor, primarily in terms of its composition. As an example, carbon deposition from methane is to be observed. In accordance with equation (1) high aromatic compounds can occur as reaction products $C_2$- to $C_4$-hydrocarbons and benzene, and if so in traces. These would cause considerable disturbance because of their high tendency towards the formation of carbon, even after supplementing the gas with fresh methane. It is therefore necessary to remove them as far as possible. The most detrimental compounds, benzene and high aromatic compounds can be removed in principle by means of condensing. One variation which is to be prefered and in which the $C_2$ to $C_4$ hydrocarbons are also removed, uses their considerably higher decomposition speed during the formation of carbon, in comparison with methane, as in equation (1). The precondition for the removal of the carbon from the gas flow is a large surface for its deposition. Such conditions can be produced in a fluidised bed with fine vortex material. This can be a carbon powder or a ceramic powder. During operation of the fluidised bed a certain percentage of fresh particles are added continually, an appropriate percentage is then taken off with the aid of an overflow in the fluidised bed. This makes stationary operation possible. If ceramic powders such as aluminium oxide powder are used, the carbon coated particles can be used for energy production by burning off the carbon and then re-introduced into the fluidised bed.

For selective removal of the undesired hydrocarbons with at the same time minimising of the methane decomposition, the fluidising bed must be operated below the temperature of the deposition or infiltration reactor. In the case of carbon infiltration with methane, a typical temperature is 1050 to 1100° C. The fluidising bed is operated at a lower temperature of about 100 K. This procedure for the separation of the undesired hydrocarbons is possible for two reasons. The first reason is described by equation (1). The second, even more important reason is the substantially higher activating energy of the methane decomposition in comparison to the carbon formation from the C2 to C4 hydrocarbons, benzene and higher aromatic compounds. A slight drop in temperature therefore makes it possible for a working off reaction of the undesired hydrocarbons, which are still supported by the large surface in the fluidising bed because the high reaction speed is only lowered slightly with the sinking temperature. In the case of methane on the other hand, the decomposition reaction is practically frozen to a stop by this drop in temperature, i.e. it does not work or works only to a very limited extent.

In the course of previous observations up to now, no account was taken of the fact that hydrogen is created both in the decomposition of methane in the deposition or infiltration reactor and also in the carbon deposition in the fluidising bed. If this was not removed, there would be a continual addition of hydrogen in circulation system gas. It is therefore necessary, after the fluidising bed reactor and before the feeding in of fresh methane, that a certain amount of gas is transferred outward, so that the hydrogen partial pressure in the circulation gas remains constant. The amount of the gas to be transferred outward is primarily oriented to the decomposition of the methane in the deposition or infiltration reactor. The gas transferred outward can be used as high calorie fuel gas and under certain circumstances also for heating the deposition reactor.

Nevertheless, a certain percentage of hydrogen remains in the circulation gas. Hydrogen is not designated as an inert gas since it affects both decomposition reactions of the methane in the gas phase and also deposition reactions of the carbon on the substrate surface. In the chemical gas phase infiltration a certain hydrogen partial pressure is even advantageous. It reduces the decomposition of methane in the gas phase and increases the diffusion in the pores because of its small mol mass. With the aid of examples it will be shown that an even better pore filling can be achieved with hydrogen in the circulation gas than without hydrogen.

The foregoing considerations have been concentrating on the chemical gas phase infiltration of carbon. They are equally valid for the chemical gas phase infiltration of other refractory substances, especially for the chemical gas phase infiltration of silicon carbide. Also in this case, higher and in part cyclical compounds can be formed, resembling benzene which must be removed from the circulation gas and which can in the same way be removed in a fluidising bed reactor. In the deposition of silicon carbide, the reaction gas which arises is not hydrogen but hydrogen chloride. This must also be removed in the same way that hydrogen is removed in part in the carbon deposition from the process or circulation gas.

Through the formation of hydrogen chloride and its circulation system is divergent from equation (2) in that it is also possible to use methyltrichlorosilane as the educt gas, as this reacts with hydrogen chloride with a high level of selectivity to $SiCl_4$ and $CH_4$ (equation (10)):

$$CH_3SiCl_3 + HCl \rightarrow SiCl_4 + CH_4 \quad (10)$$

The advantage of methyltrichlorosilane is that it is easier to handle.

According to the invention it is possible that the infiltration of the porous structure is interrupted when carrying out a mechanical cleaning of the surface of the porous structure. However, according to a prefered embodiment of the invention the process of infiltration is carried out without interruption when carrying out a mechanical cleaning of the surface of the porous structure.

A diagram for a complete system for chemical gas phase infiltration according to the invention is represented in FIG. 3.

The advantages of the process according to the invention could be confirmed by experimental evaluations. Examples of experiments on the infiltration of C confirming effects which are taken advantage of by the process according to the invention are shown below. Reference is made to the drawings.

BRIEF DESCRIPTION OF THE DRAWINGS

In the drawing there is shown:

FIGS. 1A to 1C a schematic diagram of an infiltration reactor for parts with large diameter or length to thickness ratio;

FIG. 11$b$ the cumulative pore volume of a porous, cylindrical substrate after 79 hours infiltration under the infiltration conditions $p_{total}$=20 kPa, T=1100° C., τ=0.16 sec, $P_{CH4}$=10 Pa, $P_{Ar}$=10 kPa;

DETAILED DESCRIPTION OF THE INVENTION

Experimental Example 1

Figure 2:
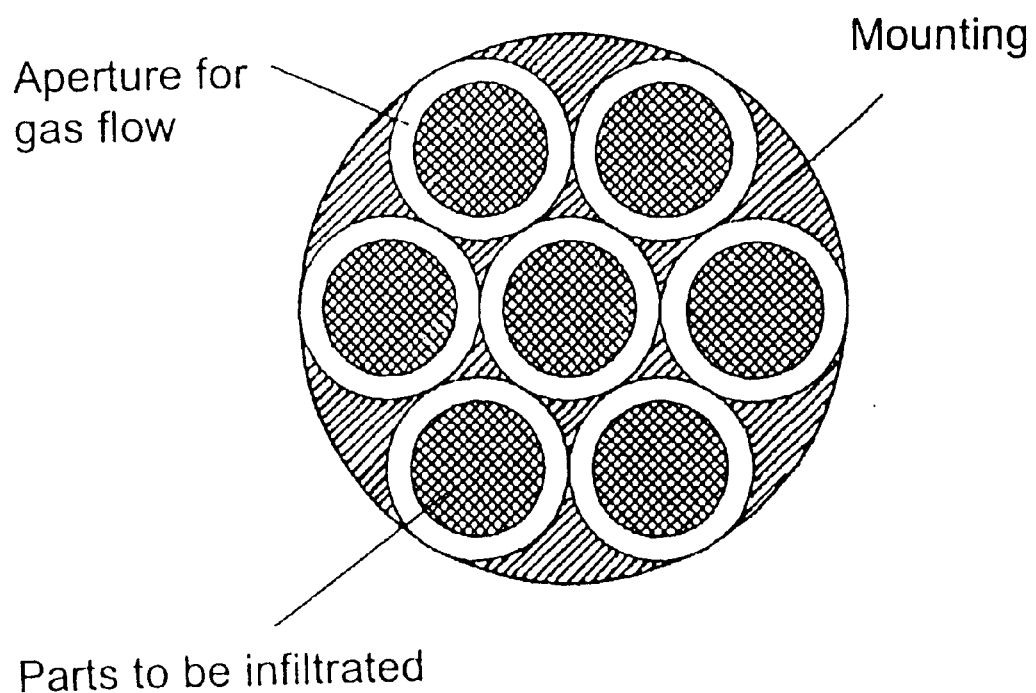
FIG. 2 a horizontal section through the fitted part of the infiltration reactor for cylindrical parts with medium to small diameter/length to thickness ratio.
Figure 3:
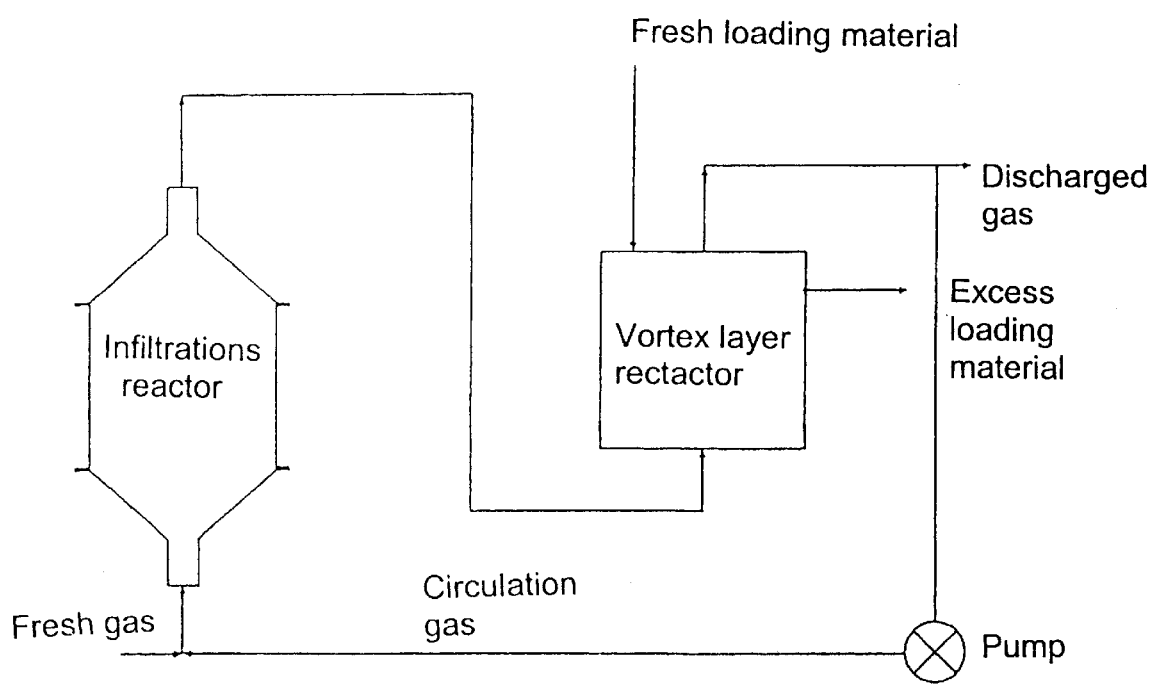
FIG. 3 a schematic flow chart in the circulation system with deposition of intermediate products.
Figure 4:
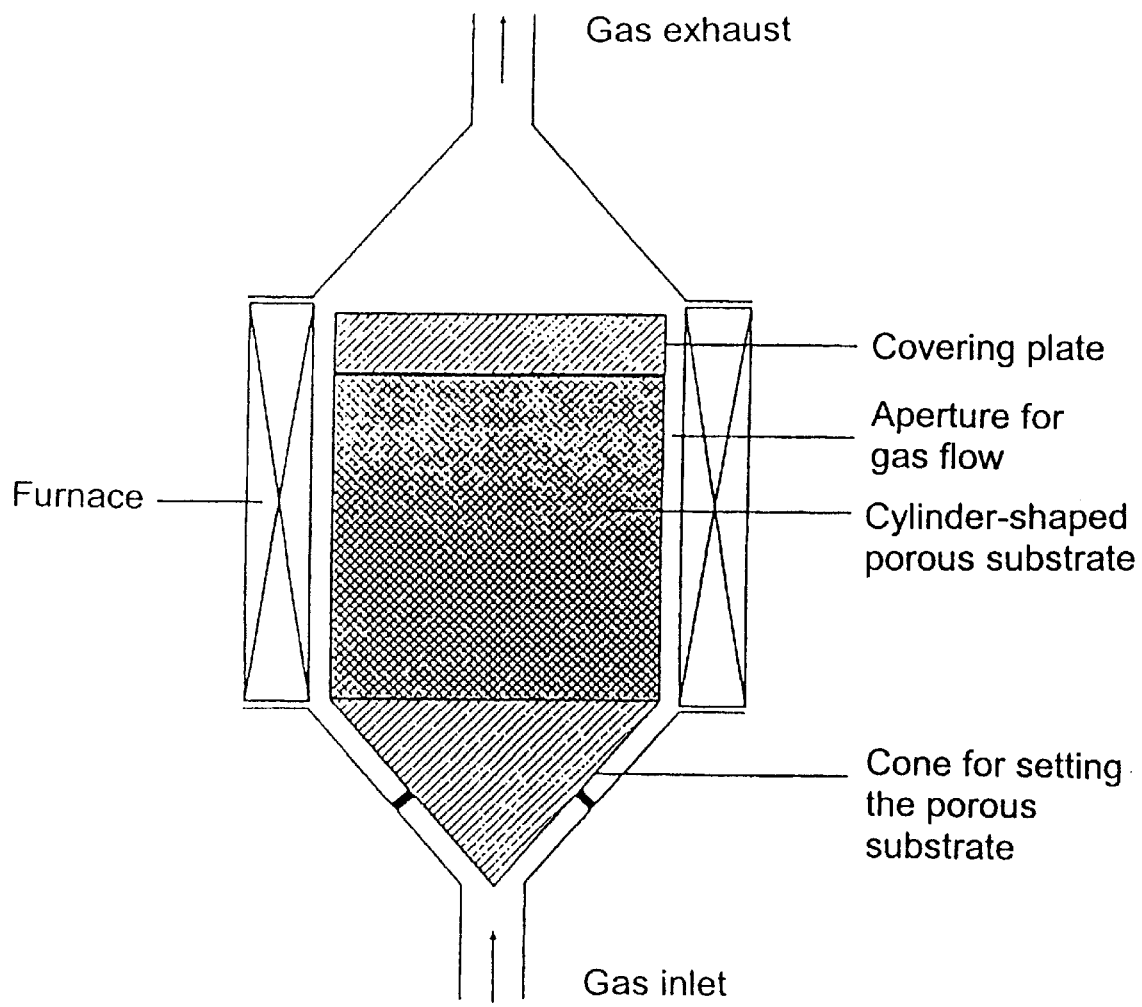
FIG. 4 a section through the test reactor, schematic representation.

The investigations on the method subject of the invention were carried out in a vertical short pipe reactor with conical inflow jet. This approximates a technical deposition reactor in accordance with FIG. 2. FIG. 4 shows a schematic sketch of the reactor. The cylindrical, porous substrate of aluminium oxide ceramic has a diameter of 16 mm. The aperture between the substrate and the reactor wall has a thickness of 2 mm. The porous substrate is positioned on a cone of solid ceramic standing in inverse position. At the top it is covered by a plate of solid ceramic in order to ensure an infiltration prefered in radial direction. The conical inflow jets make it possible for the starting gases to enter the cylindrical deposition part of the reactor practically in non decomposed state. A defined, vortex-free flow of the gas with a short direct contact time at medium gas flow is made possible by the vertical arrangement, the cone and the concentrated arrangement of the cylinder with thin slots between the wall, the cone and the cylindrical sample; these conditions fulfil the criteria of the method according to the invention.

Figure 5:
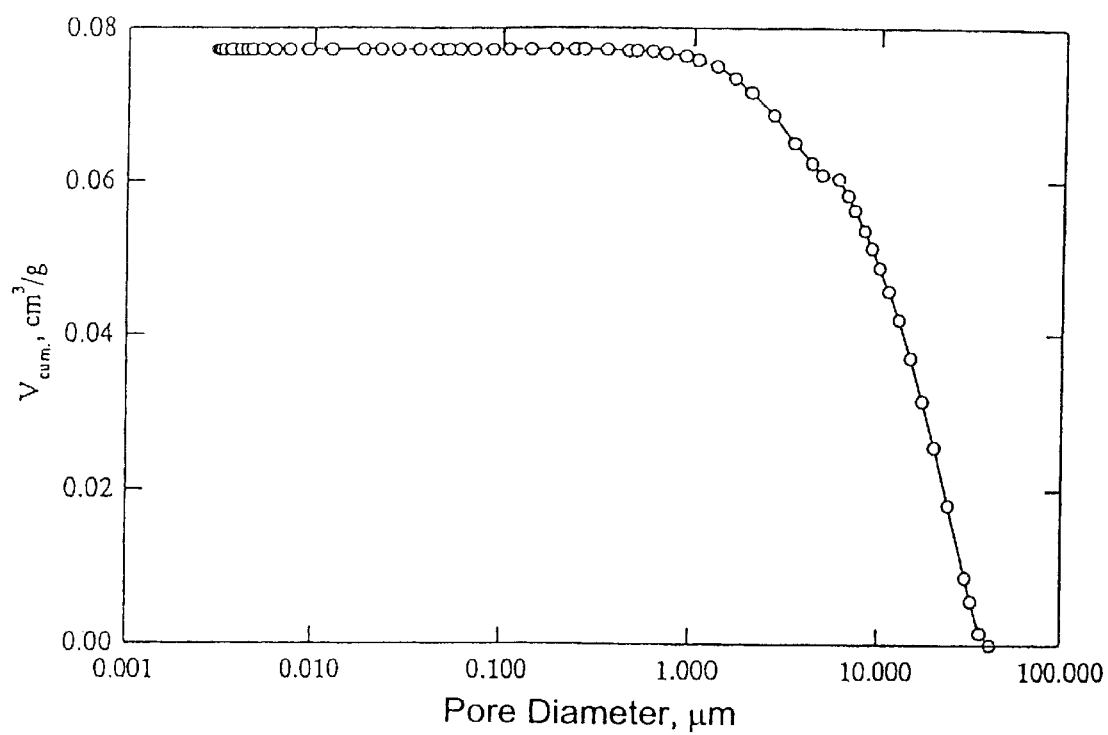
FIG. 5 the cumulative pore volume of the porous, cylindrical substrate in dependency on pore diameter.

The porous, cylindrical substrate used in all the methods has a diameter of 1.6 cm, height of 2 cm and a body density of 2.86 g/cm; it is composed of an aluminium ceramic. The open porosity is 23.24%; closed porosity not applicable. FIG. 5 shows the pore diameter spread, determined with the aid of mercury porosity measuring. This pore diameter spread serves in the following examples as a reference for infiltrated samples. The infiltration in this and all the following examples always takes place at 1100° C. and with a medium direct contact time of 0.16 s. referring to the cylindrical reactor part.

The first example treats the influence of methane partial pressure at a total pressure of 20 kPa. The methane partial pressure is varied by the additional mixing of argon as inert gas. The influence of the inert gas is therefore also represented simultaneously.

Figure 6:
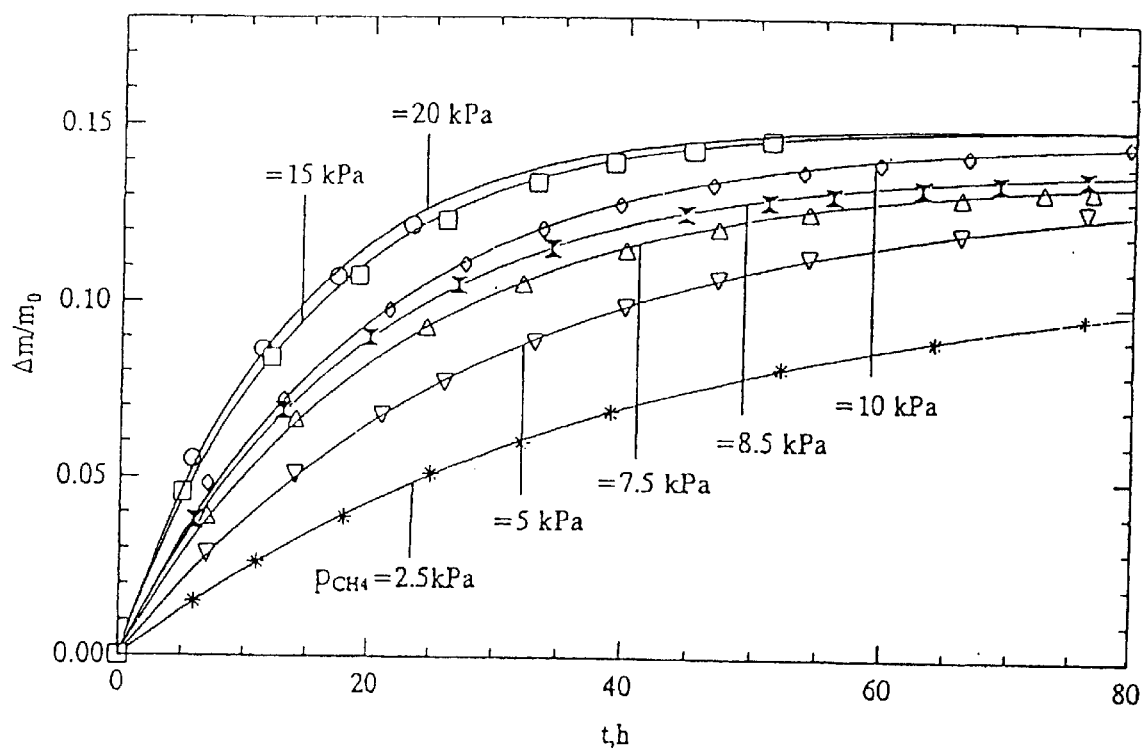
FIG. 6 the relative mass increase of the porous, cylindrical substrate in dependency on the infiltration time under the following conditions: $p_{total}$=20 kPa, T=1100° C., T=0.16 sec., methane argon mixtures of various composition.

FIG. 6 shows the relative mass increase of the sample as a result of the infiltrated carbon in dependency on the duration of infiltration. A relative mass increase of 0.15 corresponds to a pore filling of 94% (see later). FIG. 6 shows that the speed of the infiltration increases with rising methane partial pressure and this in the whole area of the partial pressure examined of 2.5 to 20 kPa, whereby the latter partial pressure corresponds to the total pressure. This is particularly clearly recognisable in the initial rising gradient of the curves $[d(\Delta m/m_o)/dt]_{t=0}$.

Figure 7:
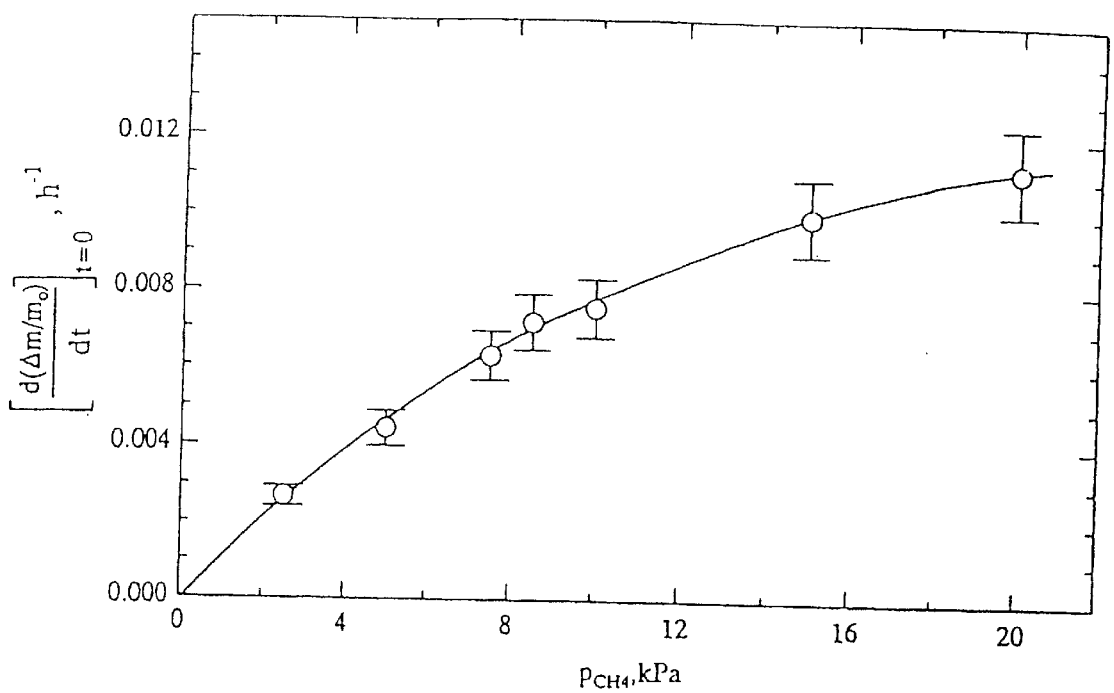
FIG. 7 the initial rate of the relative mass increase in dependency on the methane partial pressure under the method conditions corresponding to FIG. 6.

FIG. 7 illustrates these speeds in dependency on methane partial pressure. The curve follows a clear hyperbolic course i.e. the reaction speed in dependency on methane partial pressure only follows a law of the first order in the case of very small partial pressure, at high partial pressure the order goes formally towards nil. In this case, saturation absorption has been reached i.e. if the methane partial pressure continues to rise, the deposition speed does not increase any further.

The hyperbolic curve in FIG. 7 can be described in simplified form by the following equation (11):

$$[d(\Delta m/m_o)/dt]_{t=0}=(k_1{}^*p_{CH4})/(k_2+k_3{}^*p_{CH4}) \quad (11)$$

It can be seen that for small methane partial pressures, the rate of the reaction is formally of first order, at high methane partial pressure formally of zeroth order, namely then, when saturation absorption has occurred.

The inverse of equation 11 is equal to equation 12

$$[d(\Delta m/m_o)/dt]^{-1}{}_{t=0}=(k_3/k_1)+(k_2/k_1){}^*p_{CH4}{}^{-1} \quad (12)$$

Figure 8:
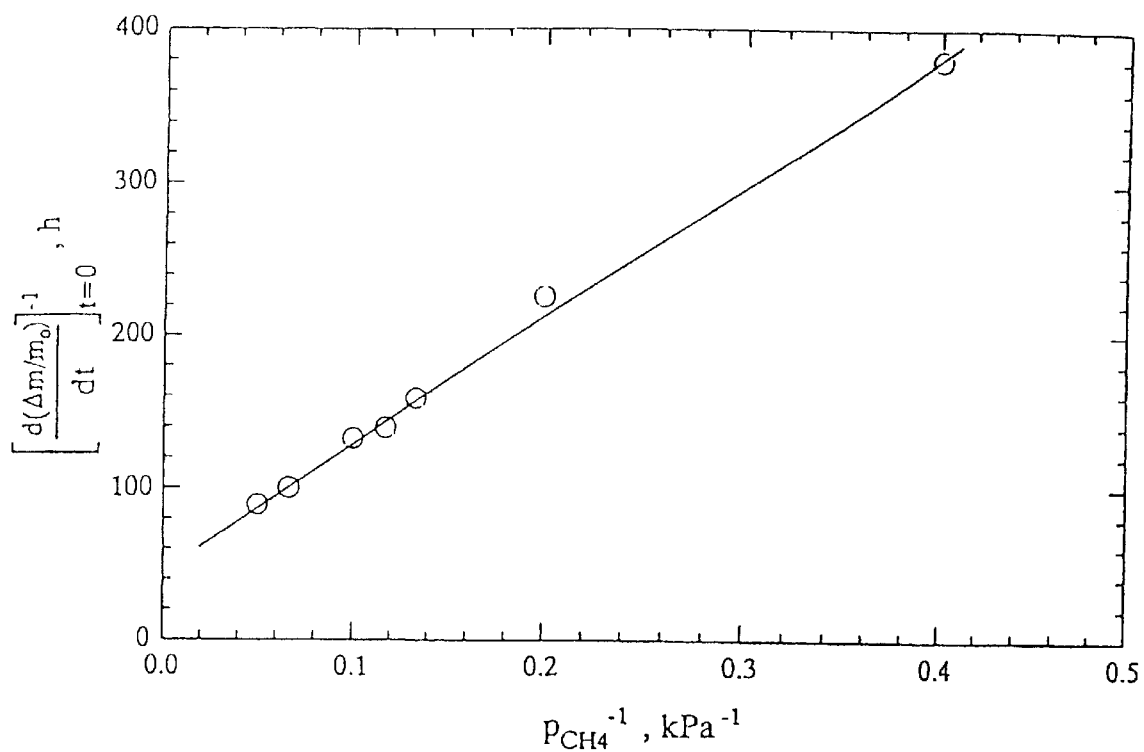
FIG. 8 a graph of the results according to FIG. 7 and equation 12.

A plot of the data points in FIG. 7 according to equation 12 yields a straight line (FIG. 8). This confirms the hyperbolic course and thereby also the saturation adsorption described repeatedly. FIG. 6 shows longer infiltration times but also that a lower partial pressure of methane even after infinitely long reaction times the same relative maximum increase in mass is obviously not reached as is the case at higher partial pressures of methane. It follows from the at higher partial pressures of methane recognizable limiting value that the deposition on the outer surface of the substrate with respect to the relative mass increase is negligible. The curves in FIG. 6 going through the data points were drawn by adjustment with the help of the empirical function in equation 13.

$$\Delta m/m_o=(\Delta m/m_o)_{t-infinity}{}^*(1-\exp(-k^*t)) \quad (13)$$

$(\Delta m/m_o)_{t=infinity}$=maximum relative mass increase in the respective infiltration.

Due to the total porosity of 23.24% and the density of the infiltrated carbon of 2.07 g/cm, the maximum possible mass increase at complete infiltration of the pores is $[(\Delta m/m_o)_{t=infinity}]$max=0.1594. The ratio of the maximum relative mass increase $(\Delta m/m_o)_{t=infinity}$ to $[(\Delta m/m_o)_{t=infinity}]$max yields the degree of pore filling, equation 14.

$$(\Delta m/m_o)_{t-infinity}/[(\Delta m/m_o)_{t-infinity}]_{max}=PFG \quad (14)$$

Figure 9:
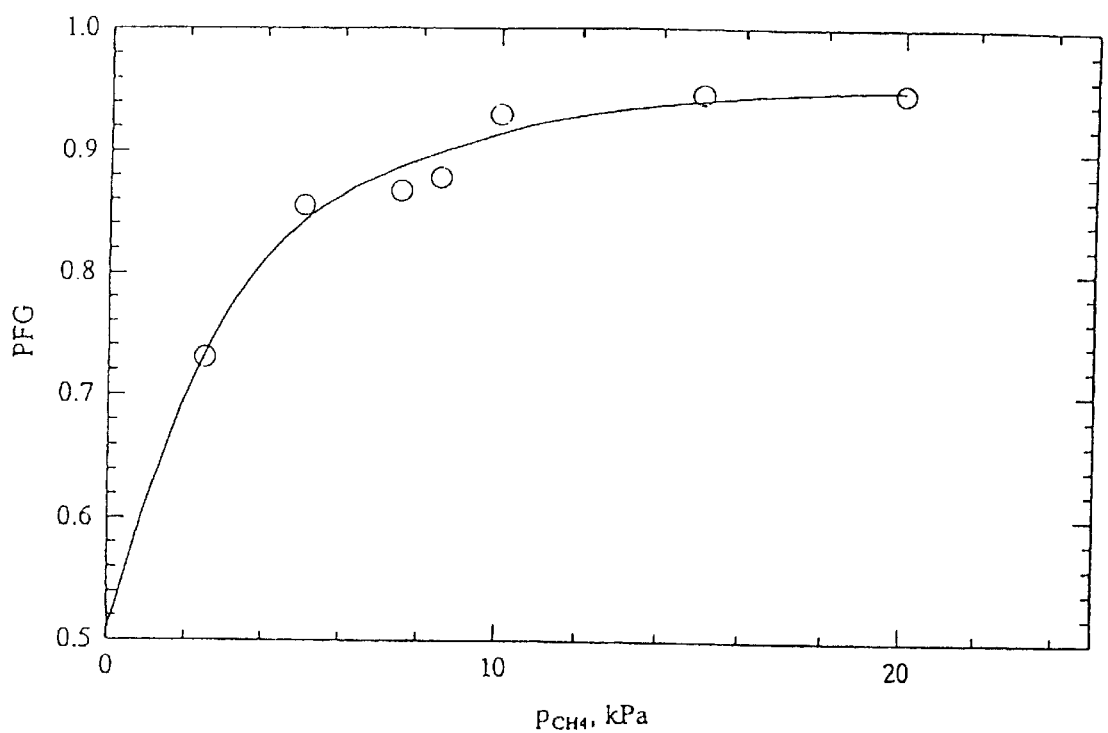
FIG. 9 the degree of pore filling in dependency on methane partial pressure under the method conditions corresponding to FIG. 6, whereby the pore filling levels are calculated according to equations (13) and (14)

FIG. 9 shows the degrees of pore filling due to infiltration of the pores as dependent on the partial pressure of methane. It is very clear that the degree of pore filling increases with the partial pressure of methane. This confirms that under the conditions according to the invention high partial pressures of methane accelerate not only the infiltration but also lead to an increasingly higher maximum degree of pore filling.

Figure 10:
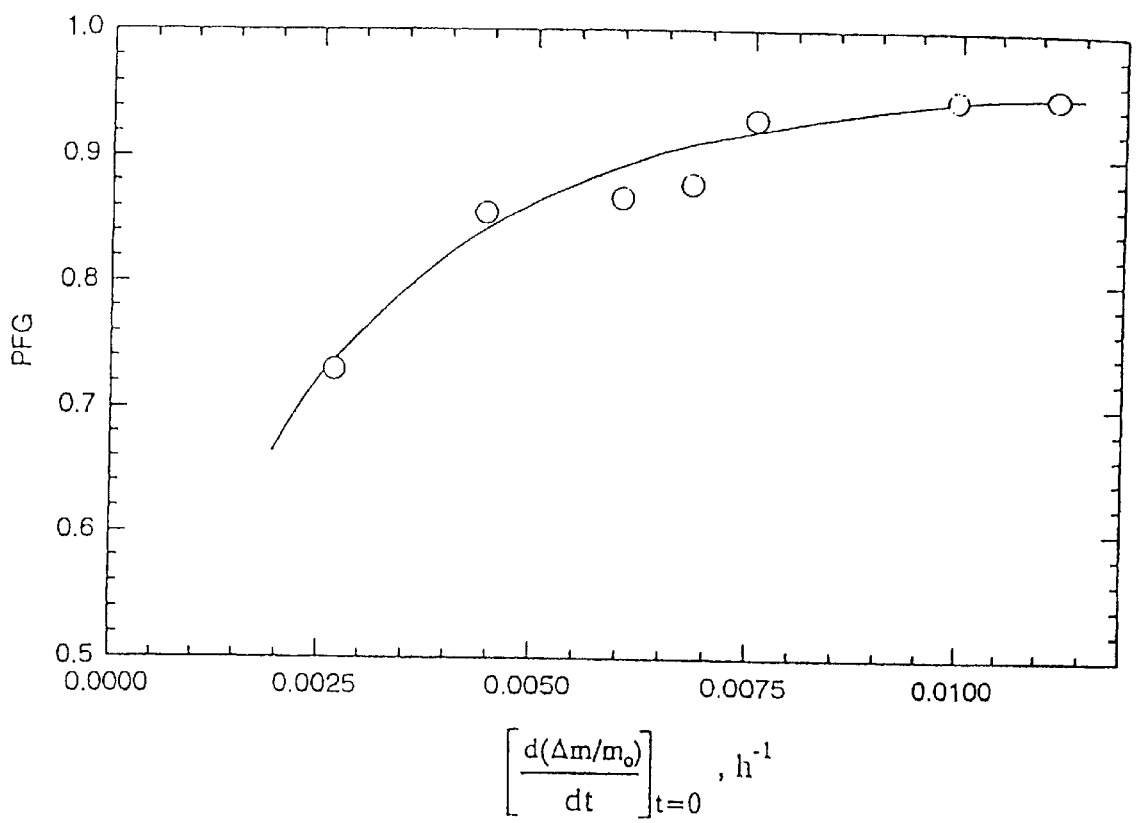
FIG. 10 the degree of pore filling in dependency on the infiltration speed, represented with the aid of the initial rate of the infiltration.

To round out the picture, one can also represent the degrees of pore filling as dependent on the rate of infiltration; this representation is shown in FIG. 10. This figure shows directly and unambiguously that the high rates of infiltration realized according to the method of the invention make a maximal pore filling possible. And also not only slow rates of infiltration as postulated in the literature, for example W. V. Kotlensky, in Chemistry and Physics of Carbon, Vol. 9, edited by P. L. Walker, P. A. Thrower, Marcel Dekker, New York, 1793, pg. 187: "Theoretically, the most ideal condition for pyrolytic carbon deposition in the pores will be given at infinitely small deposition rate." Furthermore, the results document very impressively that the use of an inert or a dilution gas for maximum pore filling is as harmful as a small rate of infiltration.

Figure 11A:
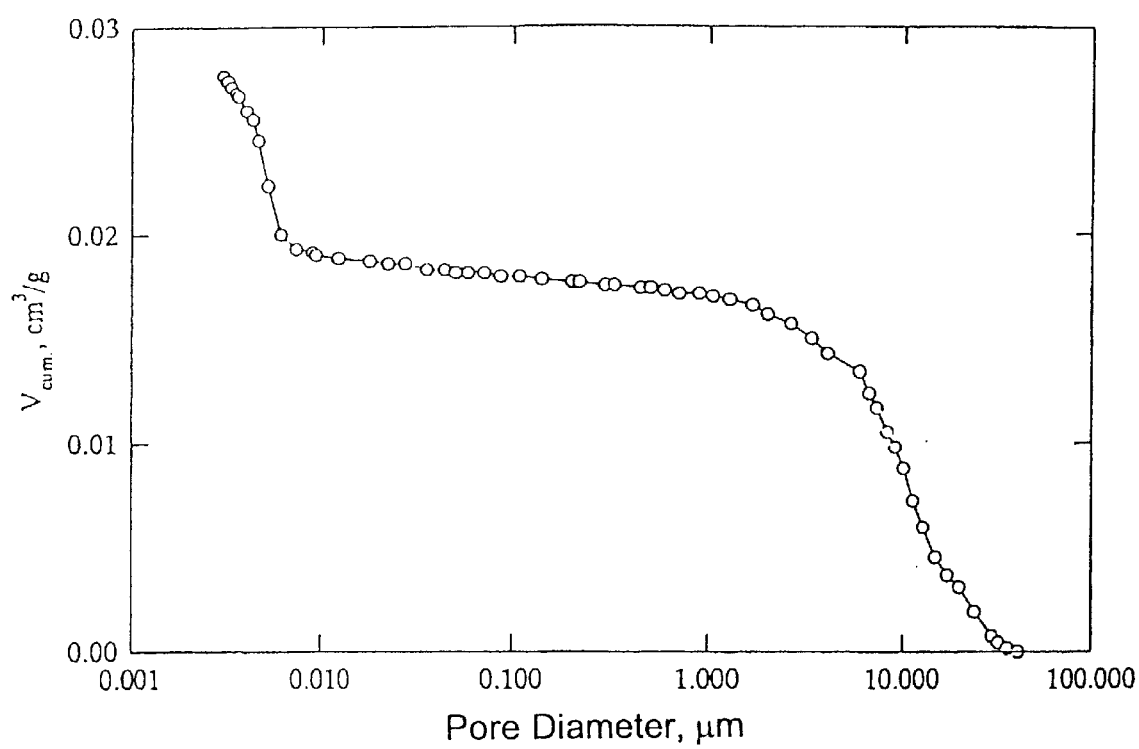
FIG. 11$a$ the cumulative pore volume of a porous, cylindrical substrate after 76 hours infiltration under the following infiltration conditions: $p_{total}$=20 kPa, T=1100° C., τ=0.16 sec, $P_{CH4}$=2.5 kPa, $P_{Ar}$=17.5 kPa.
Figure 11B:
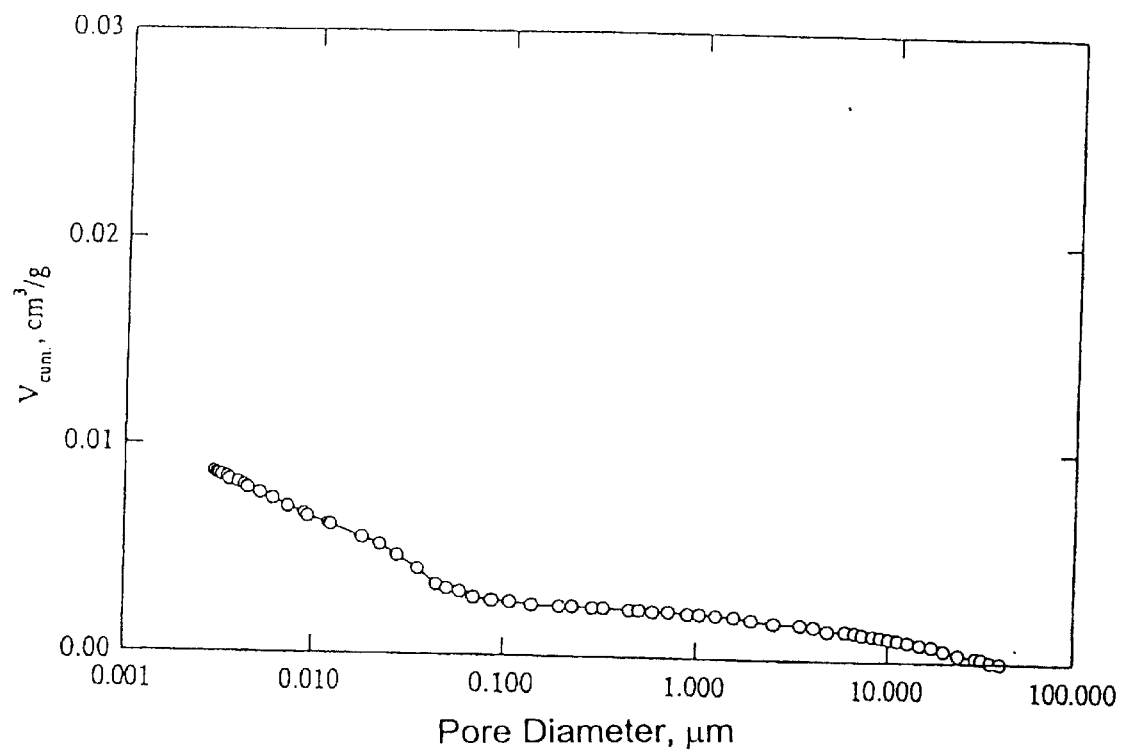

FIGS. 11a and 11b show distributions of pore diameters of the porous and cylindrical substrate after infiltration with partial pressures of methane of 2.5 and 10 kPa. In the latter case the infiltration was examined close to the maximum relative mass increase. The remaining volume of the pores is 10% (FIG. 11b). A direct comparison with FIG. 11a is not possible, since the infiltration was interrupted at 2.5 kPa before the maximum relative mass increase was reached. However the effect of the higher partial pressure of methane is impressive since the infiltration times were about the same. The micropore volume, which upon further infiltration cannot be further infiltrated, at pore diameters smaller than 0.1 μm generated through infiltration is however astonishing. It amounts in the case of small partial pressures of methane of 2.5 kPa to 0.095 cm$^3$/g, in the case of higher partial pressures of methane of 10 kPa only 0.063 cm$^3$/g, although in the latter case the pore filling is almost completed. From this it can be seen that at smaller partial pressures of methane the pores are closed earlier than at higher partial pressures of methane. This makes the advantages of the use of higher partial pressures of methane in the scope of the teaching of the invention very clear. Furthermore the distribution of pore diameters of the cylinder infiltrated with a partial pressure of methane of 15 kPa shows an even smaller micropore volume of 0.59 cm$^3$/g.

Experimental Example 2

This example described the results of experiments with pure methane at increasing total pressure. The infiltration conditions were otherwise the same as described in example 1. In other words, the temperature was 1,100° C., the persistence time of the gas was 0.16 sec.

Figure 12:
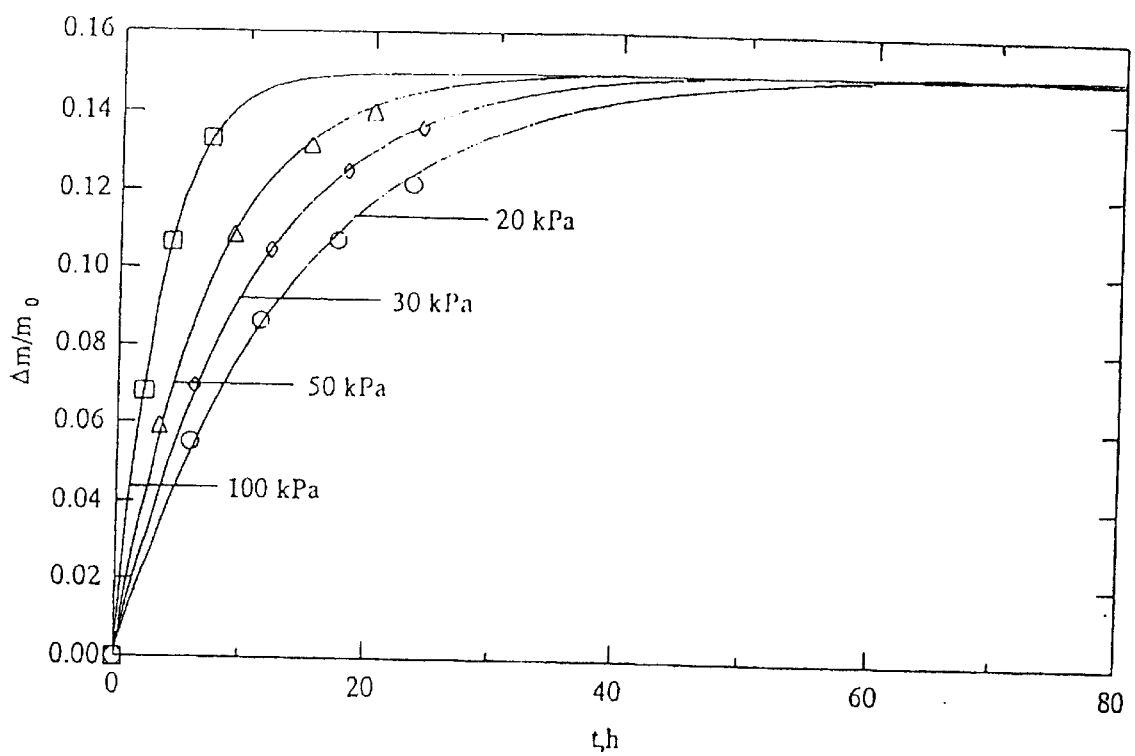
FIG. 12 the relative mass increase of a porous cylindrical substrate in dependency on the infiltration time under the infiltration conditions T=1100° C., $p_{total}$=PCH4, τ=0.16 sec.

FIG. 12 shows the relative mass increase as dependent on the duration of infiltration for partial pressures of methane of 20, 30, 50 and 100 kPa. The curves were plotted with the help of equation 13. In view of the clear nature of the results it was elected to forego the maximal infiltration. They document that an even faster infiltration is achieved with increasing partial pressures of methane, and that under these conditions a satisfactory and approximately maximum pore filling can be achieved as well.

In the experiment with 100 kPa methane, soot formation was observed after 7 hours of infiltration time. This result is not surprising since at this point the porosity is largely degraded and thus the surface has become too small for deposition. In order to exploit the high rate of infiltration at 100 kPa methane, the pressure must be reduced with progressive infiltration or the temperature has to decreased. In any event the results show that even at 50 kPa partial pressure of methane under the above conditions a maximum pore filling can be achieved in less than 40 hours. At 20 kPa partial pressure of methane, 60 hours would be necessary to achieve the same result.

Experimental Example 3

In example 3 an educt gas mixture containing hydrogen is used according to a prefered embodiment of the invention. Hereby, a recirculation of gas is realized. The following results demonstrate the very positive effect of the hydrogen with respect to the maximum pore filling.

The experiments were conducted at a total pressure of 20 kPa using methane/argon/hydrogen mixtures at a constant partial pressure of hydrogen of 2.5 kPa. The reaction temperature was 1,100° C., the persistence time 0.16 sec.

Figure 13:
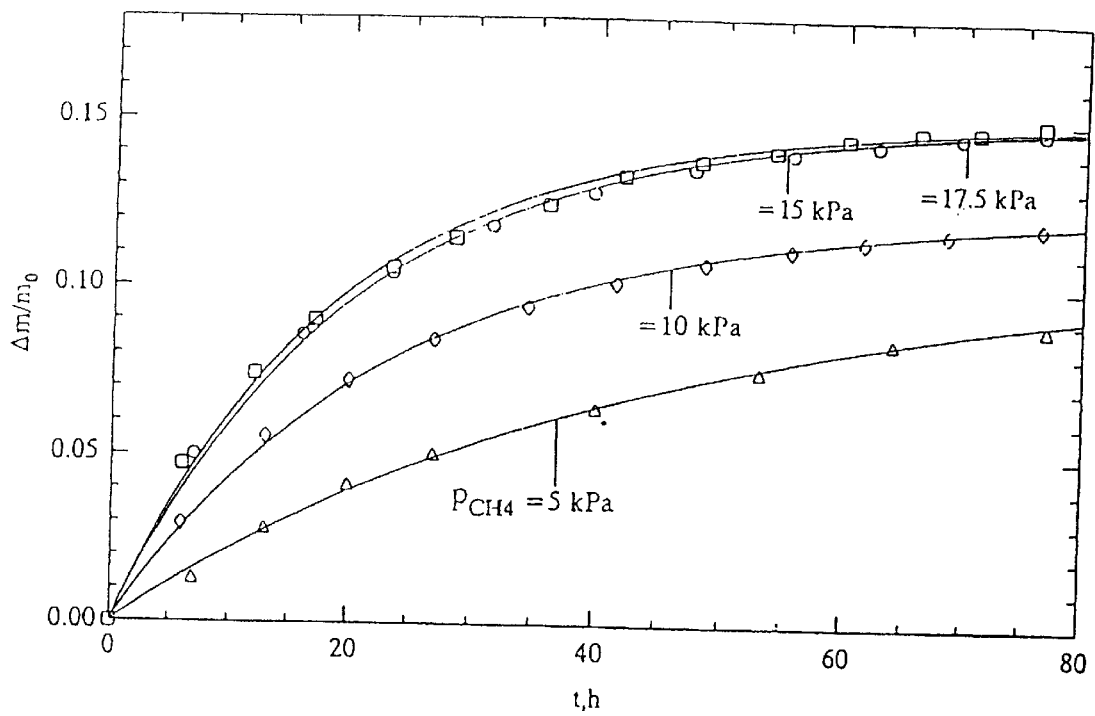
FIG. 13 the relative mass increase or a porous cylindrical substrate in dependency on the infiltration time under the infiltration conditions T=1100° C., $p_{total}$=20 kPa, $P_{H2}$=2.5 kPa, $P_{CH4}$ ascending, $P_{Ar}$ descending.

FIG. 13 shows the relative mass increase of the porous cylindrical substrate as dependent on the infiltration time. It is obvious that the infiltration rate increases with increasing partial pressure of methane. This means that the optimal result is achieved at a partial pressure of methane of 17.5 kPa and a partial pressure of hydrogen of 2.5 kPa, that is in the absence of the inert gas argon.

Figure 14:
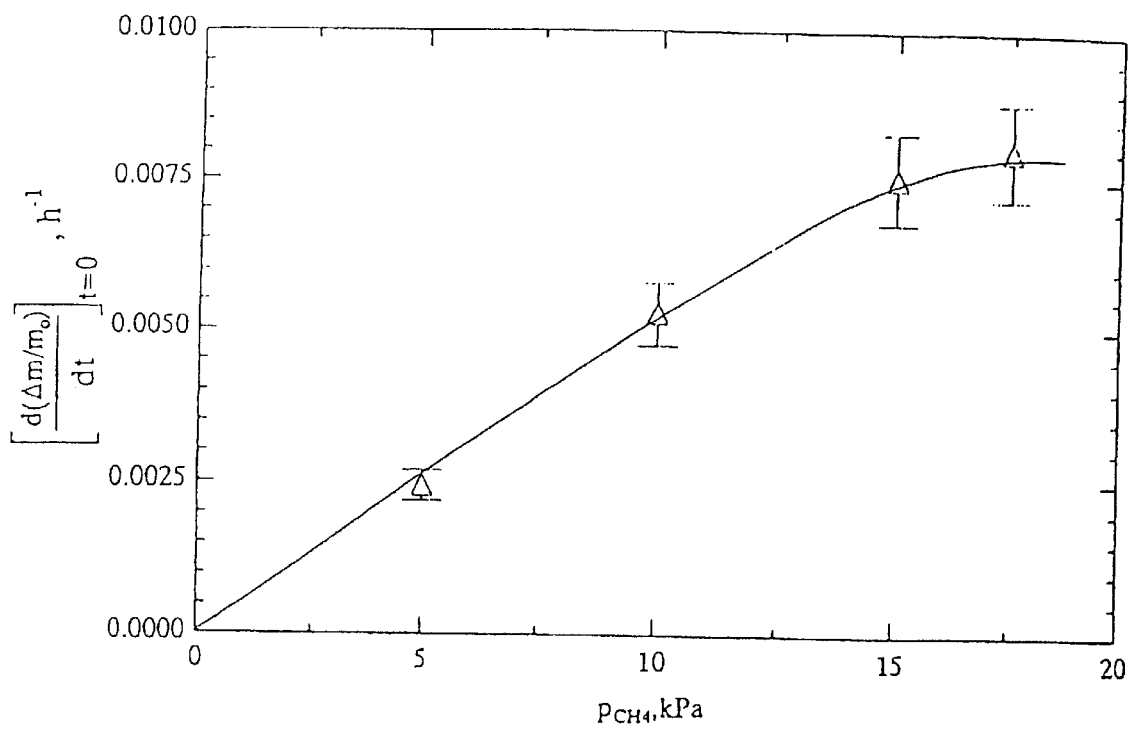
FIG. 14 the initial speed of the relative mass increase in dependency on methane partial pressure under the infiltration conditions corresponding to FIG. 13.

FIG. 14 shows the initial rate of infiltration $[d(\Delta m/m_o)/dt]_{t=0}$ as dependent on the partial pressure of methane. The result is similar to that in FIG. 7. At the highest partial pressure of methane, saturation adsorption is nearly reached; the infiltration rate is formally of zeroth order.

Figure 15:
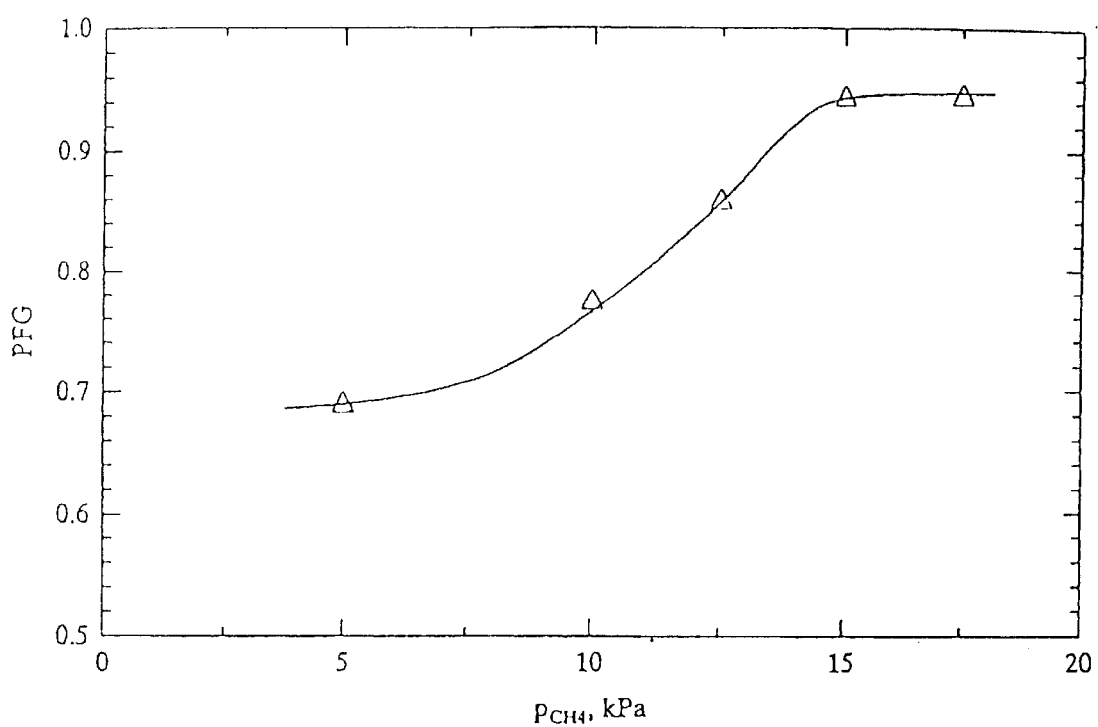
FIG. 15 the degree of pore filling in dependency on the methane partial pressure under the infiltration conditions corresponding to FIG. 13.
Figure 16:
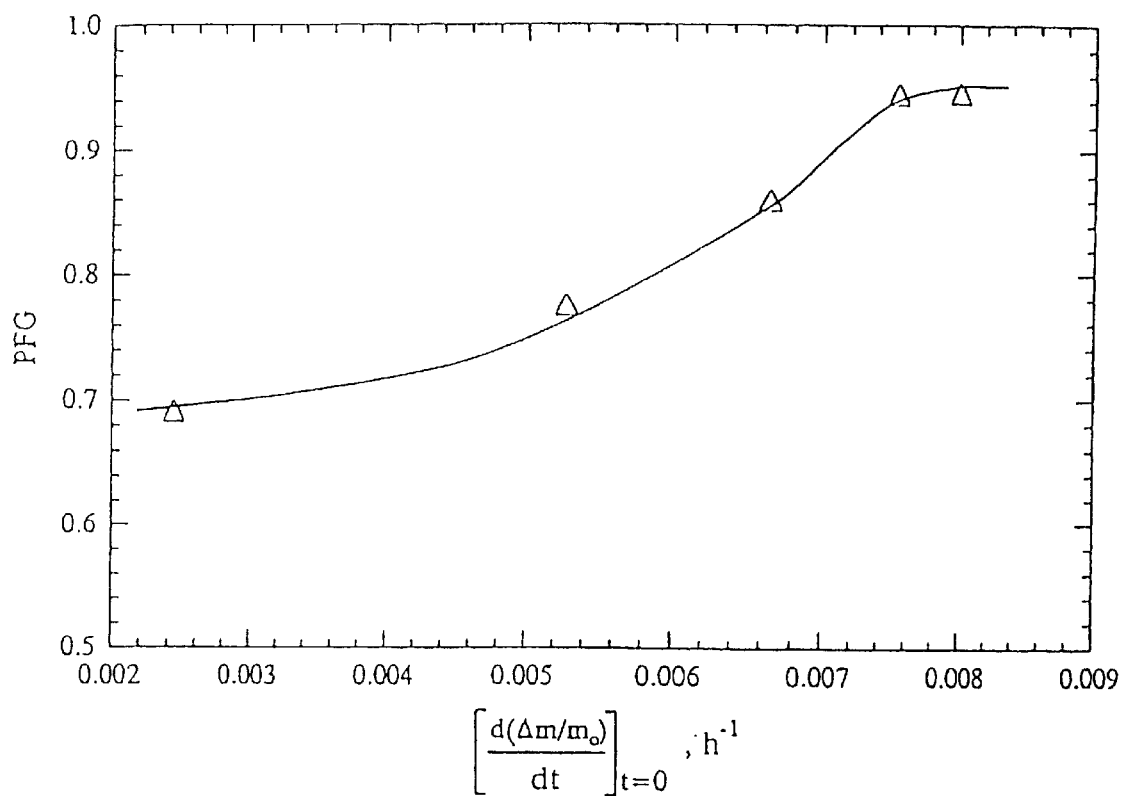
FIG. 16 the degree of pore filling in dependency on the initial rate of infiltration under the infiltration conditions corresponding to FIG. 13.
Figure 17:
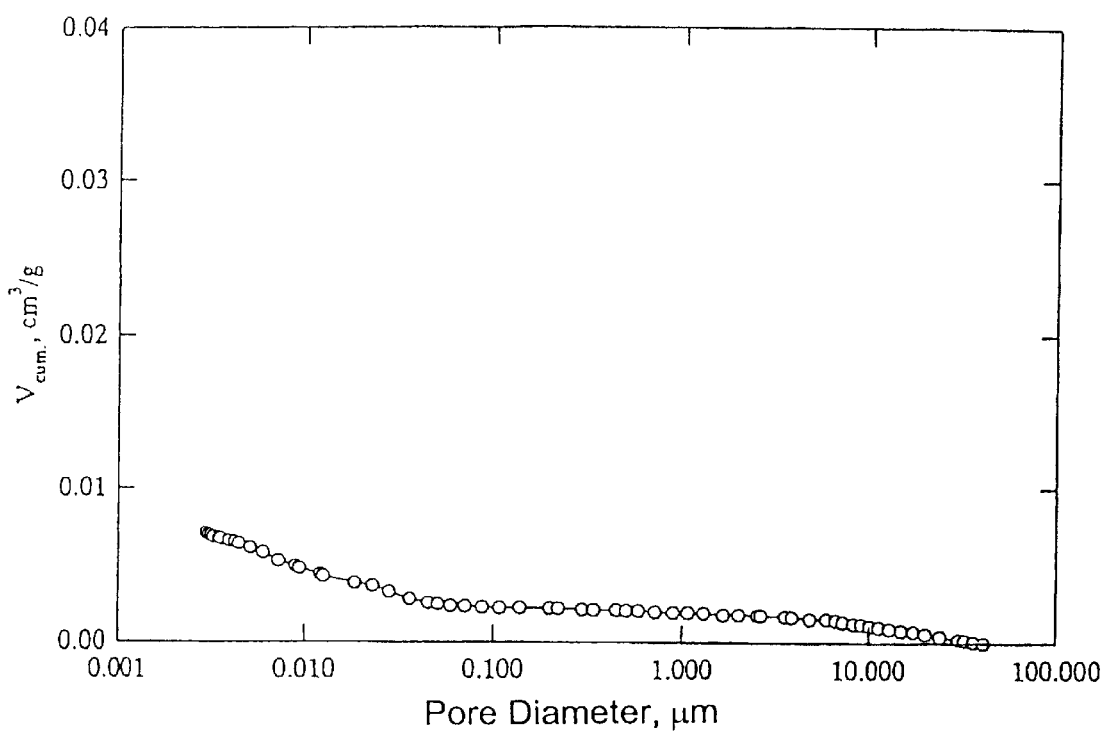
FIG. 17 the cumulative pore volume of a porous, cylindrical substrate after 77 hours of infiltration under the infiltration conditions $p_{total}$=20 kPa, T=1100° C., τ=0.16 sec. $P_{CH4}$=15 kPa, $P_{CH4}$=2.5 kPa, $P_{H2}$=2.5 kPa.

Additionally, FIGS. 15 and 16 show the maximum possible relative mass increase as dependent on the partial pressure of methane (FIG. 15) as well as on initial infiltration rate (FIG. 16). The dependencies differ from those of the results without hydrogen (FIGS. 9 and 10). However, they document clearly the importance of higher partial pressures of methane as taught according to the invention and higher rates of infiltration disprove hereby the general view in the state of the art and in the literature (see above). The favorable effect of the addition of hydrogen is confirmed by the results of the distribution of pore diameters. The cylinder which was infiltrated with a mixture of methane/argon/hydrogen 15/2.5/2.5 kPa was examined (FIG. 17). Its effective residual porosity is only 9.6%, the micropore volume with pore diameters smaller than 0.1 μm only 0.046 cm$^3$/g. This result is achieved especially through the addition of hydrogen as taught according to the invention.

Figure 18:
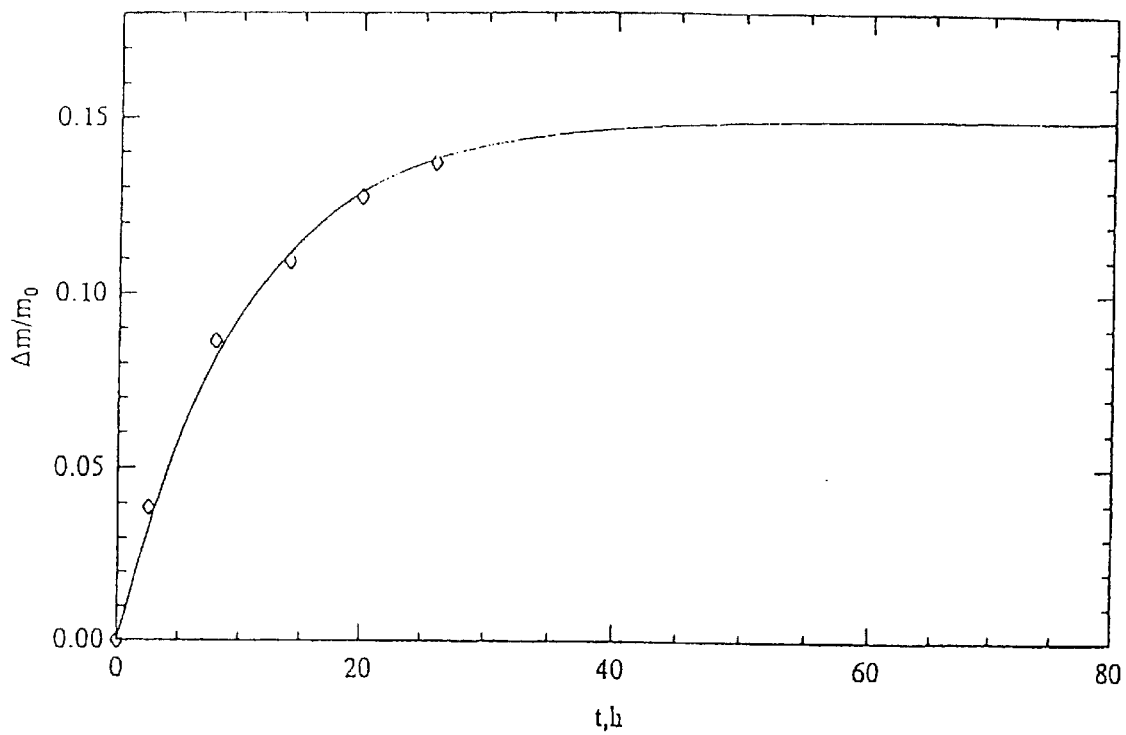
FIG. 18 the relative mass increase of a porous cylindrical substrate in dependency on the infiltration time under the infiltration conditions $p_{tota}$=50 kPa, T=1100° C., $P_{CH4}$=43.75 kPa, $P_{H2}$=6.25 kPa.

The deposition of carbon and, with it, the rate of infiltration is decreased by the hydrogen, which is a phenomenon known from the literature. To compensate for this decrease methane/hydrogen mixtures of higher total pressure are used according to the invention. The result of the embodiment of the process with a total pressure of 50 kPa with a methane/hydrogen mixture of the composition 43.75/6.25 kPa is shown in FIG. 18. The curve trajectory was plotted with equation 13. At this total pressure the infiltration is terminated as early as after 40 hours. With the same ratio of methane/hydrogen of 7 to 1 but at a total pressure of 20 kPa, 80 hours—twice as much time—is necessary (FIG. 18). This result emphasizes once more the superior advantage of high pressures and refutes the view as held in the state of the art as well as in the literature.

Experimental Example 4

After the advantageous effect of the addition of hydrogen on the degree of pore filling during the chemical vapor infiltration of carbon as shown in example 3, the positive effect of the addition of hydrogen to achieve the conditions of saturation adsorption taught according to the invention which are essential to the process was confirmed in example 4. The results, analogous to example 2, which were obtained with pure methane at increasing total pressure are compared to results obtained with a mixture of methane and hydrogen in a molar ratio of 6 to 1 at increasing total pressure and otherwise identical conditions.

Figure 19:
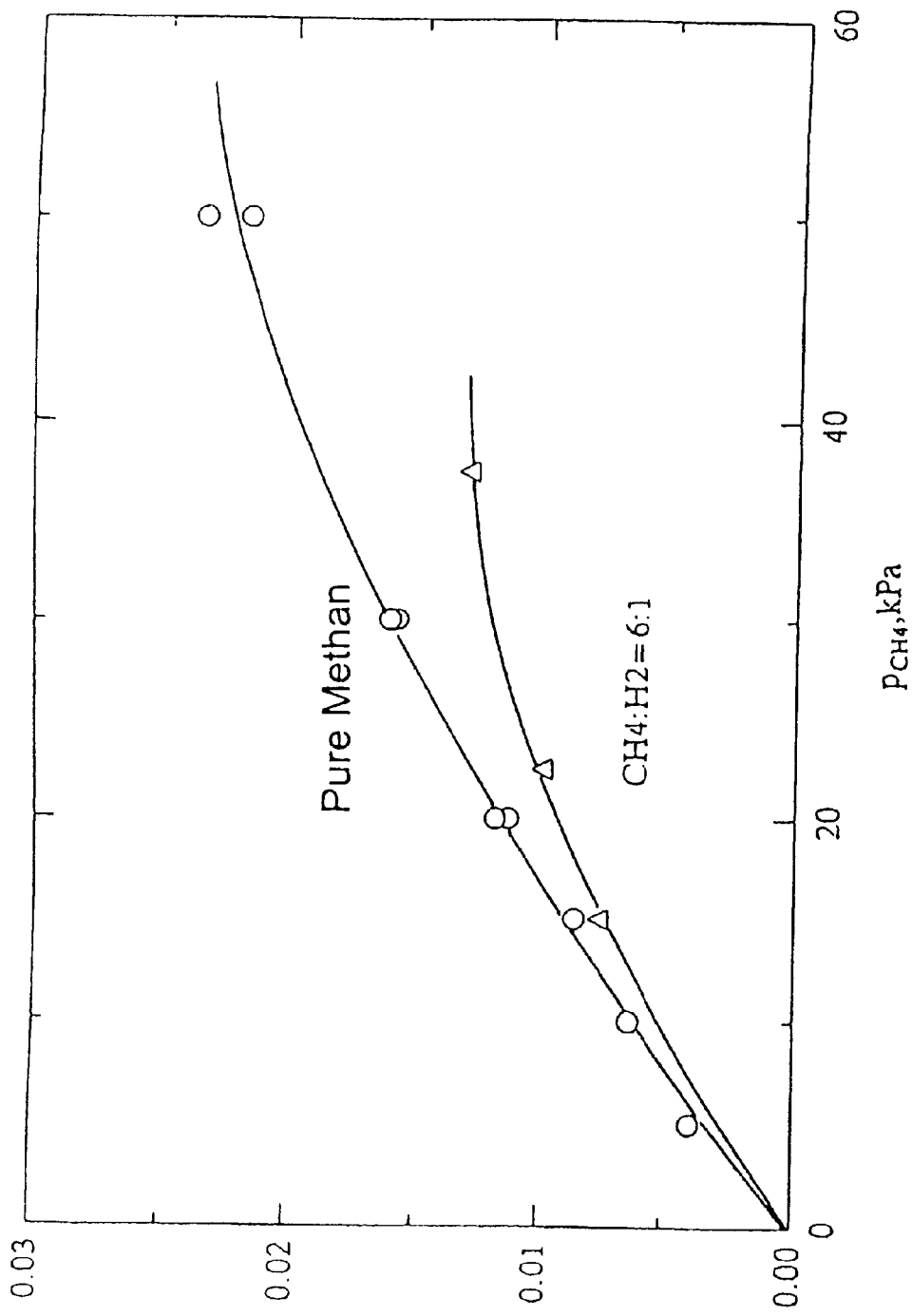
FIG. 19 the initial speed of the relative mass increase in dependency on methane partial pressure which in the case of pure methane i.e. the of the above curve, corresponds to the total pressure.

To document the saturation adsorption, the initial rates of the relative mass increase are reused. These are shown in FIG. 19. In the case of the use of pure methane, the region of saturation adsorption at a pressure of about 50 kPa is achieved, which could be too high depending on the thickness of the parts or the porous structures to be infiltrated. However, if a methane/hydrogen mixture with a hydrogen content of less than 15% is used, the region corresponding to the saturation adsorption is already reached at a partial pressure of methane of 25 to 30 kPa.

Prefered embodiments of the invention are described for the case in connection with the drawing.

Embodiment 1

Processes for the chemical vapor infiltration of refractory substances such as C or SiC are mainly used in the production of fiber-reinforced composite materials which in the English literature are termed ceramic matrix composites (CMC). A prefered embodiment of the invention for the production of a carbon-fiber-reinforced carbon by chemical vapor infiltration of carbon in a carbon fiber structure is described:

Felt is used as the carbon fiber structure. The structure has a diameter of 36.5 mm and a thickness of 20 mm, corresponding to a volume of about 19 cm$^3$. The initial weight is 3.8 g. In assuming a density about 1.8 g/cm$^3$ for the carbon fibers, the fibers have a volume of about 2 cm$^3$. The free pore volume prior to infiltration is thereby about 17 cm$^3$.

The infiltration is carried out as follows:

Total pressure $P_{total}$=20 kPa, temperature T=1,100° C., persistence time of the gas in the reaction zone τ=0.33 sec. The gas used is a mixture of methane and hydrogen in a molar ratio of 7 to 1. The conditions are adjusted such that as complete an infiltration as possible is achieved in an acceptable amount of time. Under these conditions about 10% of the carbon which is added with the educt gas methane is deposited in the porous structure. The integration of the fiber structure in the reactor is achieved with the help of a special mounting of two cm thickness according to FIG. 1. Between the special mounting and the side retaining borders is an aperture of 2 mm width.

After 6 days of continuous infiltration, the infiltrated fiber structure has a weight of 36.1 g. Taking into account the density of the deposited carbon of 2.07 g/cm$^3$, a degree of pore filling of over 92%, or a remaining porosity of less than 8% was found. The medium density is 1.9 g/cm$^3$. Under no circumstances can similar results be achieved with procedures in the state of the art, even after week- or month-long infiltration. To this come the added difficulty that the infiltration process in the state of the art must be interrupted several times in order to mechanically clean the surfaces.

Embodiment 2

An infiltration of carbon with technically pure methane is carried out. The total pressure is 20 kPa, the temperature 1,100° C., the persistence time τ is adjusted to 0.16 sec. The porous structure is subjected to a gas flow applied through apertures of 2 mm width. Widths of apertures smaller than 50 mm yield usable pore fillings under high pressures in the region of saturation adsorption as taught according to the invention. By using aperture widths of less than 25 mm, pore fillings in the region of saturation adsorption are achieved, which are better than the ones attainable through common processes, with the high pressures taught according to the invention. Best results are achieved with regard to pore filling and production speed in a region of 1 to 5 mm, as seen in the present embodiments. The widths of the apertures are chosen to be larger than 1 mm in order to facilitate isobaric pressure conditions with short persistence times. Insofar as isobaric pressure conditions can be achieved with narrower aperture widths, these can be smaller than 1 mm.

Embodiment 3

The following infiltration conditions are maintained:

Temperature T=1,100° C.

Total pressure $P_{total}$=26 kPa to 100 kPa

Gas flow with pure methane

Persistence time τ=0.16 sec

As can be seen in FIG. 12, the maximum pore filling can be achieved in the region of the pressures as defined in this embodiment after 50 hours, which corresponds to an acceptable production speed.

Embodiment 4

The following infiltration conditions are maintained for the infiltration of carbon Temperature T=1,100° C.

Total pressure $P_{total}$=26 kPa to 50 kPa

Persistence time τ=0.16 sec to 0.33 sec

Partial Pressure $P_{CH4}$=⅞ $P_{total}$

Partial Pressure $P_{H2}$=⅛ $P_{total}$

As can be seen in FIG. 18, the pore filling degree, which is close to the maximum reachable pore filling, under these reaction conditions is already reached after 30 hours of infiltration.

Embodiment 5

An infiltration of carbon is carried out in connection with the infiltration conditions used in FIGS. 6 and 9. This means that a methane/argon mixture is used. Partial pressures of methane are used corresponding to the regions shown in the curve in FIG. 9, in which good degrees of pore fillings can be achieved, in other words above 10 kPa. Deposition rates are maintained at 10% to 25% by setting the persistence time.

Embodiment 6

The same infiltration conditions as shown in embodiment 5 are used, however the partial pressure of methane is in the region for which the curve of relative mass increase shown in FIG. 14 flattens out, in other words above 15 kPa.

Embodiment 7

For the infiltration of carbon a mixture of methane and hydrogen in a ratio of 6 to 1 is used. The temperature 1,080° C. Depending on the pressure, the persistence time is between 0.01 and 0.9 sec. The partial pressure of methane is adjusted in the region for which the curve in FIG. 9 flattens, indicating the presence of conditions in the region of saturation adsorption. Therefore a pressure of greater than 15 kPa and smaller than 30 kPa or, during the process for maintaining especially fast production rates, of 25 kPa to 50 kPa is maintained.

Embodiment 8

The same infiltration conditions as described in the above embodiments are used with the exception that methane is replaced by methyltrichlorosilane and hydrogen is replaced by hydrogen chloride, and that the process temperature is adjusted to about 1,000° C.

We claim:

1. An isobaric and isothermic method of chemical vapor infiltration of refractory materials into a porous substrate in a reaction zone comprising:

disposing the porous substrate into the reaction zone;

providing a linear flow of an educt gas comprising deposable material in the reaction zone, at a reaction temperature and a reaction pressure that produces saturation adsorption of the deposable material onto the substrate; and wherein the linear flow is adjusted to have a flow rate such that no more than 50% of the deposable material is deposited into the porous substrate.

2. The method of claim 1 wherein the linear flow is directed from the bottom to the top of the reaction zone.

3. The method of claim 2 wherein the linear flow of educt gas is free of admixed inert gas.

4. The method of claim 2 wherein the porous substrate is subdivided in spaced substrate parts, the substrate parts being adjusted apart from one another in such a way as to yield widths of equal spacing therebetween.

5. The method of claim 1 wherein the refractory material comprises carbon.

6. The method of claim 1 wherein the refractory material is carbon.

7. The method of claim 1 wherein the refractory material comprises silicon.

8. The method of claim 1 wherein the refractory material is silicon carbide.

9. The method of claim 1 wherein the educt gas comprises methane or natural gas.

10. The method of claim 1 wherein the educt gas is methane or natural gas.

11. The method of claim 10 wherein the educt gas further comprises hydrogen gas.

12. The method of claim 11 wherein the ratio by volume of methane or natural gas to hydrogen gas is between 20:1 to 2:1.

13. The method of claim 11 wherein the ratio by volume of methane or natural gas to hydrogen gas is between 10:1 to 5:1.

14. The method according to any of claims 6, 10, or 11, wherein the temperature in the reaction zone is between 1000° C. and 1200° C.

15. The method of claim 1 wherein the educt gas comprises a silicon containing compound.

16. The method of claim 15 wherein the silicon containing compound is methyltrichlorosilane.

17. The method of claim 16 wherein the educt gas further comprises hydrogen gas.

18. The method of claim 17 wherein the molar ratio of methyltrichlorosilane to hydrogen gas is between 1:1 and 1:100.

19. The method of claim 17 wherein the molar ratio of methyltrichlorosilane to hydrogen gas is between 1:2 and 1:10.

20. The method of claim 1 wherein the educt gas is methyltrichlorosilane.

21. The method according to any of claims 8, 20, or 17 wherein the temperature in the reaction zone is between 900° C. and 1100° C.

22. The method according to any of claims 8, 20, or 17 wherein the educt gas further comprises hydrogen chloride.

23. The method of claim 1 wherein the educt gas is recirculated.

24. The method of claim 1 wherein the linear flow is adjusted to have a flow rate such that no more than 10% to 25% of the disposable material is deposited into the porous substrate.

* * * * *